US009294700B2

(12) United States Patent
Nishihara et al.

(10) Patent No.: US 9,294,700 B2
(45) Date of Patent: Mar. 22, 2016

(54) IMAGING ELEMENT, IMAGING DEVICE, ELECTRONIC DEVICE, AND IMAGING METHOD

(71) Applicant: Sony Corporation, Tokyo (JP)

(72) Inventors: Toshiyuki Nishihara, Kanagawa (JP); Hirofumi Sumi, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 14/364,641

(22) PCT Filed: Dec. 19, 2012

(86) PCT No.: PCT/JP2012/082879

§ 371 (c)(1),
(2) Date: Jun. 11, 2014

(87) PCT Pub. No.: WO2013/099723

PCT Pub. Date: Jul. 4, 2013

(65) Prior Publication Data

US 2014/0375855 A1 Dec. 25, 2014

(30) Foreign Application Priority Data

Dec. 27, 2011 (JP) ................................ 2011-285070
Jul. 9, 2012 (JP) ................................ 2012-153824

(51) Int. Cl.

| | |
|---|---|
| ***H04N 3/14*** | (2006.01) |
| ***H04N 5/335*** | (2011.01) |
| ***H04N 5/3745*** | (2011.01) |
| ***H01L 27/146*** | (2006.01) |
| ***H04N 5/378*** | (2011.01) |
| ***H03M 1/10*** | (2006.01) |
| ***H04N 5/357*** | (2011.01) |
| *H03M 1/56* | (2006.01) |

(52) U.S. Cl.

CPC ........ *H04N 5/37457* (2013.01); *H01L 27/1461* (2013.01); *H01L 27/14603* (2013.01); *H01L 27/14612* (2013.01); *H03M 1/1019* (2013.01); *H04N 5/3575* (2013.01); *H04N 5/378* (2013.01); *H04N 5/37455* (2013.01); *H03M 1/56* (2013.01); *H04N 5/3745* (2013.01)

(58) Field of Classification Search

CPC ............ H04N 5/37457; H04N 5/3575; H04N 5/37455; H04N 5/378; H04N 5/3745; H03M 1/1019; H03M 1/56; H01L 27/14603; H01L 27/1461; H01L 27/14612

USPC ......................... 348/294, 298, 302, 308, 312; 250/208.1; 257/290–292

See application file for complete search history.

(56) References Cited

U.S. PATENT DOCUMENTS

| | | | | |
|---|---|---|---|---|
| 2007/0052564 | A1 | 3/2007 | Funakoshi et al. | |
| 2008/0180546 | A1* | 7/2008 | Thanh et al. | 348/229.1 |
| 2010/0060764 | A1 | 3/2010 | McCarten et al. | |
| 2010/0243866 | A1* | 9/2010 | Mo et al. | 250/214 A |

FOREIGN PATENT DOCUMENTS

| | | | |
|---|---|---|---|
| JP | 2007-074447 | A | 3/2007 |
| JP | 2008-141609 | A | 6/2008 |

(Continued)

*Primary Examiner* — Yogesh Aggarwal

(74) *Attorney, Agent, or Firm* — Hazuki International, LLC

(57) ABSTRACT

To improve the speed of AD conversion. An amplifier amplifies, by a magnification larger than 1, signals of a pixel that outputs a signal in which there is no accumulation of a charge by a photon as a reset signal, and outputs a signal in which there is accumulation of a charge by a photon as an accumulation signal. A calculation unit generates an offset amount signal corresponding to an amount of own offset component using the amplified signal, and calculates a digital value corresponding to the own offset component using the generated offset amount signal and accuracy set for AD conversion of the amplified accumulated signal.

19 Claims, 18 Drawing Sheets

(56) References Cited

FOREIGN PATENT DOCUMENTS

| | | | |
|---|---|---|---|
| JP | 2011-024109 | A | 2/2011 |
| JP | 2011-082929 | A | 4/2011 |
| JP | 2011-097581 | A | 5/2011 |
| JP | 2011-119441 | A | 6/2011 |
| WO | WO-2010/030329 | A1 | 3/2010 |

* cited by examiner

*FIG. 8*

| | NO AMPLIFICATION (ANOTHER IMAGING ELEMENT) | AMPLIFICATION (IMAGING ELEMENT 110) |
|---|---|---|
| POTENTIAL DIFFERENCE OF STEP DIFFERENCE OF RAMP WAVE OF REF SIGNAL | REFERENCE (×1) | N TIMES (×N) |
| OBJECT TO BE SCANNED POTENTIAL DIFFERENCE IN RESET SIGNAL COUNT PERIOD | REFERENCE (×1) | REFERENCE (×1) |
| THE NUMBER OF STEPS IN RESET SIGNALCOUNT PERIOD | REFERENCE (×1) | 1/N TIMES (×1/N) |
| TIME LENGTH OF RESET SIGNAL COUNT PERIOD | REFERENCE (×1) | 1/N TIMES (×1/N) |

a

| | NO AMPLIFICATION (ANOTHER IMAGING ELEMENT) | AMPLIFICATION (IMAGING ELEMENT 110) |
|---|---|---|
| POTENTIAL DIFFERENCE OF STEP DIFFERENCE OF RAMP WAVE OF REF SIGNAL | REFERENCE (×1) | N TIMES (×N) |
| OBJECT TO BE SCANNED POTENTIAL DIFFERENCE IN ACCUMULATED SIGNAL COUNT PERIOD | REFERENCE (×1) | • PORTION CORRESPONDING TO POTENTIAL DIFFERENCE FOR DETECTING OFFSET COMPONENT OF COMPARATOR IS THE SAME (×1)<br>• PORTION CORRESPONDING TO POTENTIAL DIFFERENCE FOR DETECTING ACCUMULATED SIGNAL IS N TIMES (×N) |
| THE NUMBER OF STEPS IN ACCUMULATED SIGNAL COUNT PERIOD | REFERENCE (×1) | • PORTION CORRESPONDING TO THE NUMBER OF STEPS FOR DETECTING OFFSET COMPONENT OF COMPARATOR IS 1/N TIMES (×1/N)<br>• PORTION CORRESPONDING TO THE NUMBER OF STEPS FOR DETECTING ACCUMULATED SIGNAL IS THE SAME (×1) |
| TIME LENGTH OF ACCUMULATED SIGNAL COUNT PERIOD | REFERENCE (×1) | • PORTION CORRESPONDING TO TIME LENGTH FOR DETECTING OFFSET COMPONENT OF COMPARATOR IS 1/N TIMES (×1/N)<br>• PORTION CORRESPONDING TO TIME LENGTH FOR DETECTING ACCUMULATED SIGNAL IS THE SAME (×1) |

b

IMAGING ELEMENT, IMAGING DEVICE, ELECTRONIC DEVICE, AND IMAGING METHOD

TECHNICAL FIELD

The present invention relates to an imaging element. Specifically, the present invention relates to an imaging element, an imaging device, an electronic device, and an imaging method that detects weak light.

BACKGROUND ART

In recent years, devices that detect weak light have been widely introduced primarily in medical sites and research sites. In such devices, as a detection unit to detect the weak light, a relatively expensive photomultiplier tube is often used.

Further, a device that detects weak light using an imaging element such as a complementary metal oxide semiconductor (CMOS) image sensor that can be manufactured at a low price instead of a photomultiplier tube has been proposed (for example, see Patent Document 1).

CITATION LIST

Patent Document

Patent Document 1: JP 2011-97581 A

SUMMARY OF THE INVENTION

Problems to be Solved by the Invention

The above-described conventional technology detects the weak light by counting the number of photons incident on each pixel of the CMOS image sensor (photon counting).

However, since a pixel signal is very minute, most of a value detected by AD conversion is a value related to an offset component included in the pixel signal and a detection circuit.

Therefore, to increase the speed of the AD conversion related to the offset component, significant improvement of a frame rate can be expected.

The present technology has been made in view of the foregoing, and an objective is to improve a speed of AD conversion.

Solutions to Problems

The present technology has been made to solve the above problems, and the first aspect is an imaging element, an imaging device, an electronic device, and an imaging method, which include: an amplifier configured to amplify signals of a pixel at a magnification larger than 1, the pixel outputting one of the signals as a reset signal, the signal being in a state in which there is no accumulation of a charge by a photon, and outputting the other of the signals as an accumulation signal, the signal being in a state in which there is accumulation of a charge by the photon; and a calculation unit configured to generate an offset amount signal corresponding to an amount of own offset component using the amplified signal, and to calculate a digital value corresponding to the own offset component using the generated offset amount signal and accuracy set for AD conversion of the amplified accumulated signal. Accordingly, the present technology exerts an effect that the offset component of the calculation unit itself is calculated using the accuracy set for AD conversion of the accumulated signal amplified at the magnification larger than 1.

Further, in the first aspect, the calculation unit may include a holding unit configured to hold a charge in the amplified signal, a comparison unit configured to cause a signal that has offset the held charge and the amplified signal to input and to use the signal as the offset amount signal, to compare a potential of a reference signal of a ramp wave in which a potential difference of a step corresponds to the accuracy, and a potential of the offset amount signal, and to generate an offset amount signal comparison result indicating which potential is higher, and a count unit configured to count a pulse corresponding to the step of the ramp wave from a start of the comparison to when the offset amount signal comparison result is inverted, and to calculate the digital value corresponding to an offset component of the comparison unit. Accordingly, the present technology exerts an effect that the digital value corresponding to the offset component of the comparison unit is calculated by the AD conversion using the potential of the signal from which the offset component of the amplifier has been removed by offset of the held charge and the amplified signal, and the reference signal of the ramp wave in which the potential difference of the step corresponds to the accuracy.

Further, in the first aspect, the holding unit may hold a charge in a signal of the amplified reset signal, and the comparison unit performs the comparison using a signal that has offset the held charge and the signal of the amplified reset signal as the offset amount signal, and generate the offset amount signal comparison result. Accordingly, the present technology exerts an effect that the offset amount signal comparison result is generated using the reset signal.

Further, in the first aspect, the comparison unit may use a signal that has offset the held charge and a signal of the amplified accumulated signal as a signal to be digitalized, compare the potential of a reference signal of a ramp wave, and a potential of the signal to be digitalized, and generate a signal to be digitalized comparison result indicating which potential is higher, when calculating a digital value of the accumulated signal, and the count unit may perform down count from a count value in an initial state based on the offset amount signal comparison result, when calculating the digital value corresponding to an offset component of the comparison unit, and perform up count from a count value after the down count based on the signal to be digitalized comparison result, and calculate the digital value of the accumulated signal from which the digital value corresponding to an offset component of the comparison unit has been removed, when calculating the digital value of the accumulated signal. Accordingly, the present technology exerts an effect that the digital value of the accumulated signal from which the digital value corresponding to the offset component of the comparison unit has been removed is calculated in a state in which the charge in the signal that is an amplified reset signal is held in the holding unit.

Further, in the first aspect, a binary determination unit configured to compare the calculated digital value of the accumulated signal and a threshold, and to binarily determine existence of incidence of a photon to the pixel that has generated the accumulated signal may be further included. Accordingly, the present technology exerts an effect that existence of incidence of a photon to the pixel that generates the accumulated signal is binarily determined by comparison of the calculated digital value of the accumulated signal and the threshold value.

Further, in the first aspect, the comparison unit may continuously generate the offset signal comparison result to the same offset amount signal a plurality of times, and continuously generate the signal to be digitalized comparison result to the same signal to be digitalized a plurality of times, and the count unit may calculate the digital value of the accumulated signal based on an added value of respective down count values of the offset signal comparison results continuously generated a plurality of times, and an added value of respective up count values of the signal to be digitalized comparison results continuously generated a plurality of times. Accordingly, the present technology exerts an effect that the digital value of the accumulated signal from which the digital value corresponding to the offset component of the comparison unit has been removed is calculated by a plurality of times of sampling.

Further, in the first aspect, the holding unit may hold a charge in a signal of the amplified accumulated signal, the comparison unit may generate a signal that has offset the held charge and a signal of the amplified accumulated signal as the offset amount signal, when generating the offset amount signal comparison result, and use a signal that has offset the held charge and the signal of the amplified accumulated signal as a signal to be digitalized, compare the potential of a reference signal of a ramp wave and a potential of the signal to be digitalized, and generate a signal to be digitalized comparison result, when calculating the digital value of the accumulated signal, and the count unit may perform down count from a count value in an initial state based on the offset amount signal comparison result, when calculating the digital value corresponding to an offset component of the comparison unit, and perform up count from a count value after the down count based on the signal to be digitalized comparison result, and calculate the digital value of the accumulated signal from which the digital value corresponding to an offset component of the comparison unit has been removed, when calculating the digital value of the accumulated signal. Accordingly, the present technology exerts an effect that the digital value of the accumulated signal from which the digital value corresponding to the offset component of the comparison unit has been removed is calculated in a state in which the charge in the signal that is an amplified accumulated signal is held in the holding unit.

Further, in the first aspect, the comparison unit may perform the comparison using the accuracy that is decreased according to an increase in the magnification set in the amplifier. Accordingly, the present technology exerts an effect that the comparison is performed using the accuracy that is decreased according to an increase in the magnification set in the amplifier.

Further, in the first aspect, the amplifier may be configured from an operational amplifier provided in each calculation unit or a complementary metal oxide semiconductor (CMOS) inverter. Accordingly, the present technology exerts an effect that the operational amplifier or the CMOS inverter is provided in each calculation unit as the amplifier.

Further, in the first aspect, the amplifier may be configured from a source ground type amplifier transistor provided in each pixel. Accordingly, the present technology exerts an effect that the source ground type amplifier transistor provided for each pixel is provided as the amplifier.

Further, in the first aspect, the amplifier may be configured from a feedback circuit that feeds back a potential of a signal output by the pixel to a potential in floating diffusion of the pixel that has output the signal. Accordingly, the present technology exerts an effect that the potential in the floating diffusion of the pixel is amplified by feedback, and the amplified signal is output from the pixel.

Effects of the Invention

According to the present technology, an excellent effect to improve a speed of AD conversion can be exerted.

BRIEF DESCRIPTION OF DRAWINGS

FIGS. 8*a* and 8*b* are tables for comparing a ramp wave of a REF signal in the imaging element 100 of the first embodiment of the present technology, and a ramp wave of a REF signal in another imaging element.

MODE FOR CARRYING OUT THE INVENTION

Hereinafter, embodiments for implementing the present technology (hereinafter, referred to as embodiments) will be described. Description will be given in the following order.
1. First Embodiment (imaging control: an example of providing an amplifier circuit and amplifying a signal)
2. Second Embodiment (imaging control: an example of binarily determine existence of incidence of a photon based on an accumulation signal)
3. Third embodiment (imaging control: an example of a pixel of modulating a potential of an amplifier transistor at a substrate side with an accumulation charge of the pixel and obtaining an output signal)
4. Fourth Embodiment (imaging control: an example of performing a plurality of times of sampling)
5. Fifth Embodiment (imaging control: various amplifying methods)

1. First Embodiment

A Configuration Example of an Imaging Element

Figure 1:
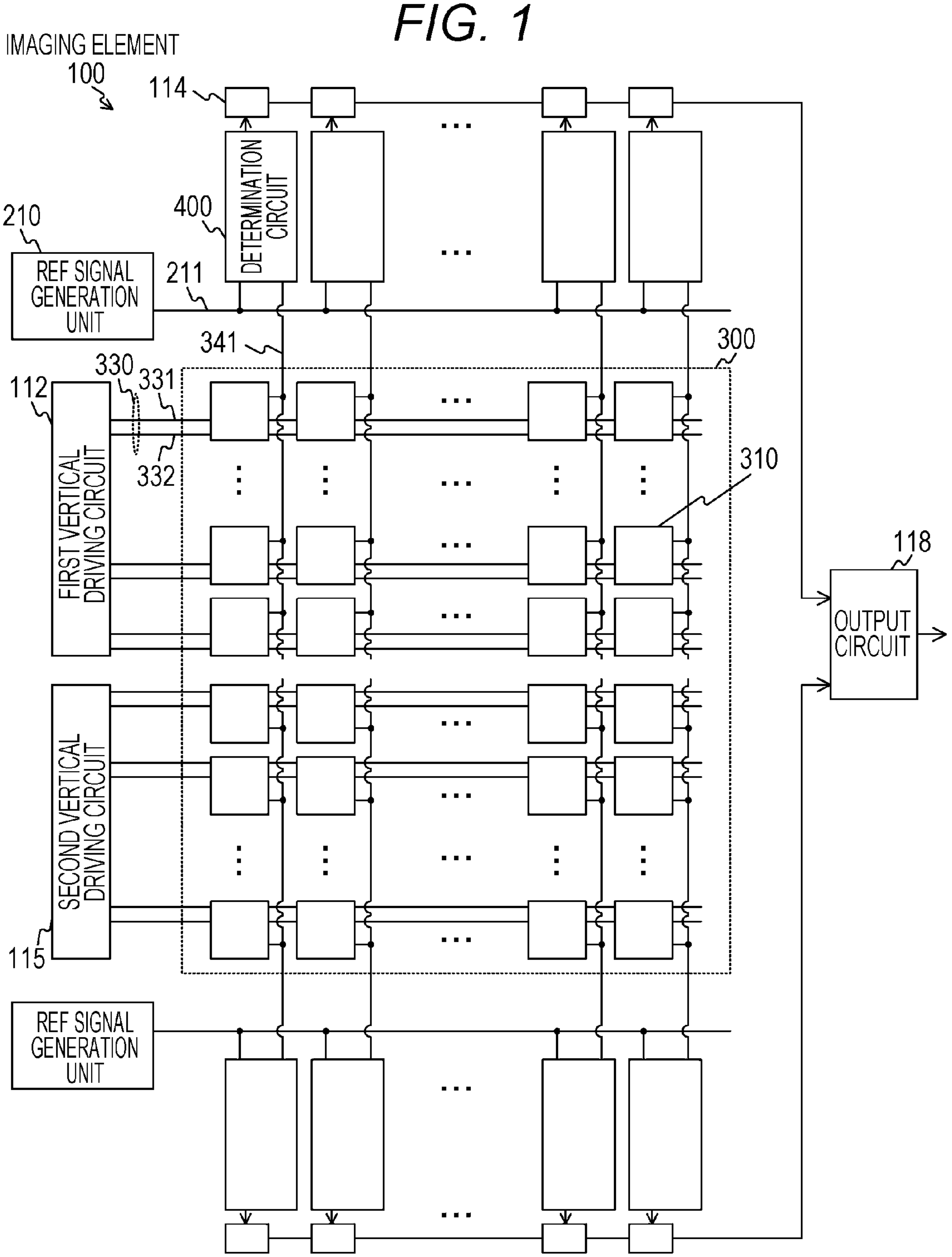
FIG. 1 is a conceptual diagram illustrating an example of a basic configuration example of an imaging element 100 of a first embodiment of the present technology.

FIG. 1 is a conceptual diagram illustrating an example of a basic configuration example of an imaging element 100 of a first embodiment of the present technology.

The imaging element 100 is a detector of light provided in a system (for example, a fluorescent scanner of an imaging plate, a radiation scintillation counter, or the like) for detecting weak light. The imaging element 100 is realized by a complementary metal oxide semiconductor (CMOS) sensor, for example.

Note that, in FIG. 1, to speed up reading, description will be given assuming that the imaging element 100 is driven (controlled) by two vertical control circuits.

The imaging element 100 includes a pixel array unit 300, a first vertical driving circuit 112, a determination circuit 400, a register 114, a second vertical driving circuit 115, an output circuit 118, and an REF (reference) signal generation unit 210. Note that a determination circuit and a register for processing a signal of a pixel driven by the second vertical driving circuit 115 are similar to the determination circuit (determination circuit 400) and the register (register 114) for processing a signal of a pixel driven by the first vertical driving circuit 112, and thus description is omitted.

The pixel array unit 300 includes a plurality of pixels (pixels 310) arranged in a two-dimensional matrix manner (n×m). Note that, in the first embodiment of the present technology, 128 row×128 column pixels 310 are arranged in the pixel array unit 300. In the pixel array unit 300 in FIG. 1, a part of the 128 row×128 column pixels 310 are illustrated. In a half of the pixels of the pixels 310 arranged in the pixel array unit 300 (the pixels positioned in the upper half of the pixel array unit 300 of FIG. 1), control lines (control lines 330) are wired from the first vertical driving circuit 112 in row units. Meanwhile, in the other half of the pixels (the pixels positioned in the lower half of the pixel array unit 300 of FIG. 1), control lines are wired from the second vertical driving circuit 115 in row units. Note that the circuit configuration of the pixels 310 will be described with reference to FIG. 2, and thus description here is omitted.

Note that, vertical signal lines (vertical signal lines 341) are wired in the pixels 310 in column units. Vertical signal lines 341 connected to the pixels to which the control lines 330 are wired from the first vertical driving circuit 112 are connected to the determination circuits 400 facing an upper side of the pixel array unit 300. Further, the vertical signal lines 341 connected to the pixels to which the control lines 330 are wired from the second vertical driving circuit 115 are connected to the determination circuits 400 facing a lower side of the pixel array unit 300.

The first vertical driving circuit 112 supplies signals to the pixels 310 through the control lines 330, and sequentially selects and scans the pixels 310 in row units in a vertical direction (column direction). By the selection and scanning of the first vertical driving circuit 112 in row units, signals are output from the pixels 310 in row units. Note that the control line 330 includes a pixel reset line 331 and a charge transfer line 332. The pixel reset line 331 and the charge transfer line 332 will be described with reference to FIG. 2, and thus description here is omitted.

Further, the second vertical driving circuit 115 is similar to the first vertical driving circuit 112 except that the pixels 310 to be controlled are different, and thus description here is omitted. The first vertical driving circuit 112 and the second vertical driving circuit 115 drive the pixels 310, so that two rows are approximately simultaneously selected and scanned, and reading from the two rows are approximately simultaneously performed.

The determination circuit 400 calculates the amount of light incident on the pixels 310 based on output signals supplied from the pixels 310. The determination circuit 400 is provided for each vertical signal line 341. That is, the 128 determination circuits 400 are respectively connected to the 128 vertical signal lines 341 wired in the pixels (64 rows×128 columns) driven by the first vertical driving circuit 112 are provided in positions facing the upper side of the pixel array unit 300. Further, the 128 determination circuits 400 respectively connected to the 128 vertical signal lines 341 wired in the pixels (64 rows×128 columns) driven by the second vertical driving circuit 115 are provided in positions facing the lower side of the pixel array unit 300.

Further, the determination circuit 400 calculates the amount of light incident on the pixels 310 after amplifying the output signals supplied from the pixel 310 by N times (N>1). Note that the determination circuit 400 will be described in FIGS. 4 to 8, and thus detailed description here is omitted. The determination circuits 400 supply determination results to the registers 114 respectively connected to the determination circuits 400.

The REF signal generation unit 210 generates an REF signal used when AD conversion is applied to the output signal supplied from the pixel 310. The same REF signal generated by the REF signal generation unit 210 is supplied to the plurality of determination circuits 400. Note that the REF signal generation unit 210 can generate the REF signal that serves as a ramp wave at a predetermined timing. Note that the REF signal will be described in FIG. 6, and thus detailed description here is omitted. The REF signal generation unit 210 supplies the generated REF signal to the plurality of determination circuits 400 through an REF signal line 211.

The registers 114 are provided to the respective determination circuits 400, and temporarily hold the determination result supplied from the determination circuits 400. The registers 114 output the held determination result to the output circuit 118 in turns in a period in which signals of next rows of the pixels are being read (reading period).

The output circuit 118 outputs a signal generated by the imaging element 100 to an external circuit.

Next, an example of a circuit configuration of the pixel 310 will be described with reference to FIG. 2.

[An Example of a Circuit Configuration of a Pixel]

Figure 2:
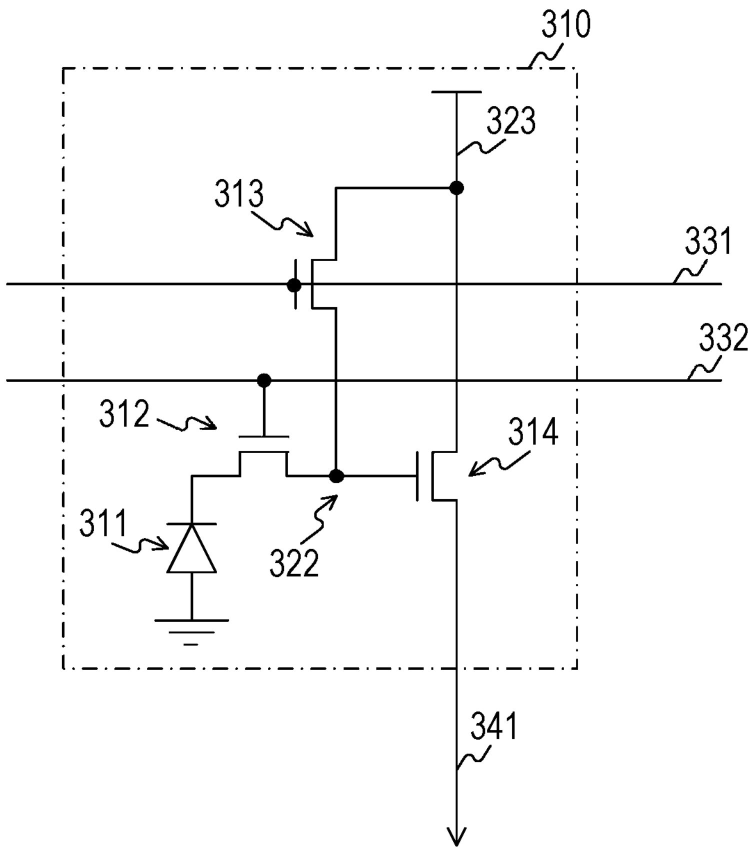
FIG. 2 is a schematic diagram illustrating an example of a circuit configuration of a pixel 310 of the first embodiment of the present technology.

FIG. 2 is a schematic diagram illustrating an example of a circuit configuration of the pixel 310 of the first embodiment of the present technology.

The pixel 310 converts an optical signal that is incident light into an electrical signal by performing photoelectric conversion. The pixel 310 amplifies the converted electrical signal, and outputs the electrical signal as a pixel signal. The pixel 310 amplifies the electrical signal by an FD amplifier having a floating diffusion (FD) layer, for example.

The pixel 310 includes a photodiode 311, a transfer transistor 312, a reset transistor 313, and an amplifier transistor 314.

In the pixel 310, an anode terminal of the photodiode 311 is grounded, and a cathode terminal is connected to a source terminal of the transfer transistor 312. Further, a gate terminal of the transfer transistor 312 is connected to the charge transfer line 332, and a drain terminal is connected to a source terminal of the reset transistor 313 and a gate terminal of the amplifier transistor 314 through a floating diffusion (FD 322).

Further, a gate terminal of the reset transistor 313 is connected to the pixel reset line 331, and a drain terminal is connected to a power line 323 and a drain terminal of the amplifier transistor 314. Further, a source terminal of the amplifier transistor 314 is connected to the vertical signal line 341.

The photodiode 311 is a photoelectric conversion element that generates a charge according to intensity of light. In the photodiode 311, a pair of an electron and a hole occurs by the photons incident on the photodiode 311, and the electron that has occurred is accumulated here.

The transfer transistor 312 transfers the electron that has occurred in the photodiode 311 to the FD 322 according to a signal (transfer pulse) from the vertical driving circuit (the first vertical driving circuit 112 or the second vertical driving circuit 115). The transfer transistor 312 becomes in a conductive state when the signal (pulse) from the charge transfer line 332 is supplied to the gate terminal thereof, for example, and transfers the electron that has occurred in the photodiode 311 to the FD 322.

The reset transistor 313 resets the potential of the FD 322 according to a signal (reset pulse) supplied from the vertical driving circuit (the first vertical driving circuit 112 or the second vertical driving circuit 115). The reset transistor 313 becomes in a conductive state when the reset signal is supplied to the gate signal through the pixel reset line 331, and a current flows from the FD 322 to the power line 323. This enables the electrons accumulated in the floating diffusion (FD 322) to be extracted to a power source, and the FD 322 is reset (hereinafter, the potential at this time is referred to as reset potential). Note that, when the photodiode 311 is reset, the transfer transistor 312 and the reset transistor 313 simultaneously become in a conductive state. This enables the electrons accumulated in the photodiode 311 to be extracted to the power source, and is reset to a state of no incident photons (dark state). Note that the potential flowing in the power line 323 (power source) is a power source used for reset and source follower, and for example, 3 V is supplied.

The amplifier transistor 314 amplifies the potential of the floating diffusion (FD 322), and outputs a signal according to the amplified potential (output signal) to the vertical signal line 341. In a state where the potential of the floating diffusion (FD 322) has been reset (when the potential is the reset potential), the amplifier transistor 314 outputs the output signal (hereinafter, referred to as reset signal) to the vertical signal line 341 according to the reset potential. Further, when the electrons accumulated in the photodiode 311 has been transferred to the FD 322, the amplifier transistor 314 outputs an output signal (hereinafter, accumulated signal) according to the amount of the transferred electrons to the vertical signal line 341. Note that, as illustrated in FIG. 1, when the vertical signal line 341 is shared by a plurality of pixel, a selection transistor may be inserted between the amplifier transistor 314 and the vertical signal line 341 for each pixel.

Note that a basic circuit and an operation mechanism of the pixel illustrated in FIG. 2 are similar to those of an ordinary pixel, and various variations can be considered. However, the pixel supposed in the present technology is designed to have significantly higher conversion efficiency than a conventional pixel. To realize that, the pixel is designed such that a parasitic capacitance (a parasitic capacitance of the FD 322) of the gate terminal of the amplifier (amplifier transistor 314) that configures a source follower can be effectively reduced to the utmost limit.

Next, an example of a layout of the pixel 310 designed such that the parasitic capacitance of the gate terminal of the amplifier transistor 314 is reduced will be described with reference to FIG. 3.

[An Example of a Plane Layout of the Pixel]

Figure 3:
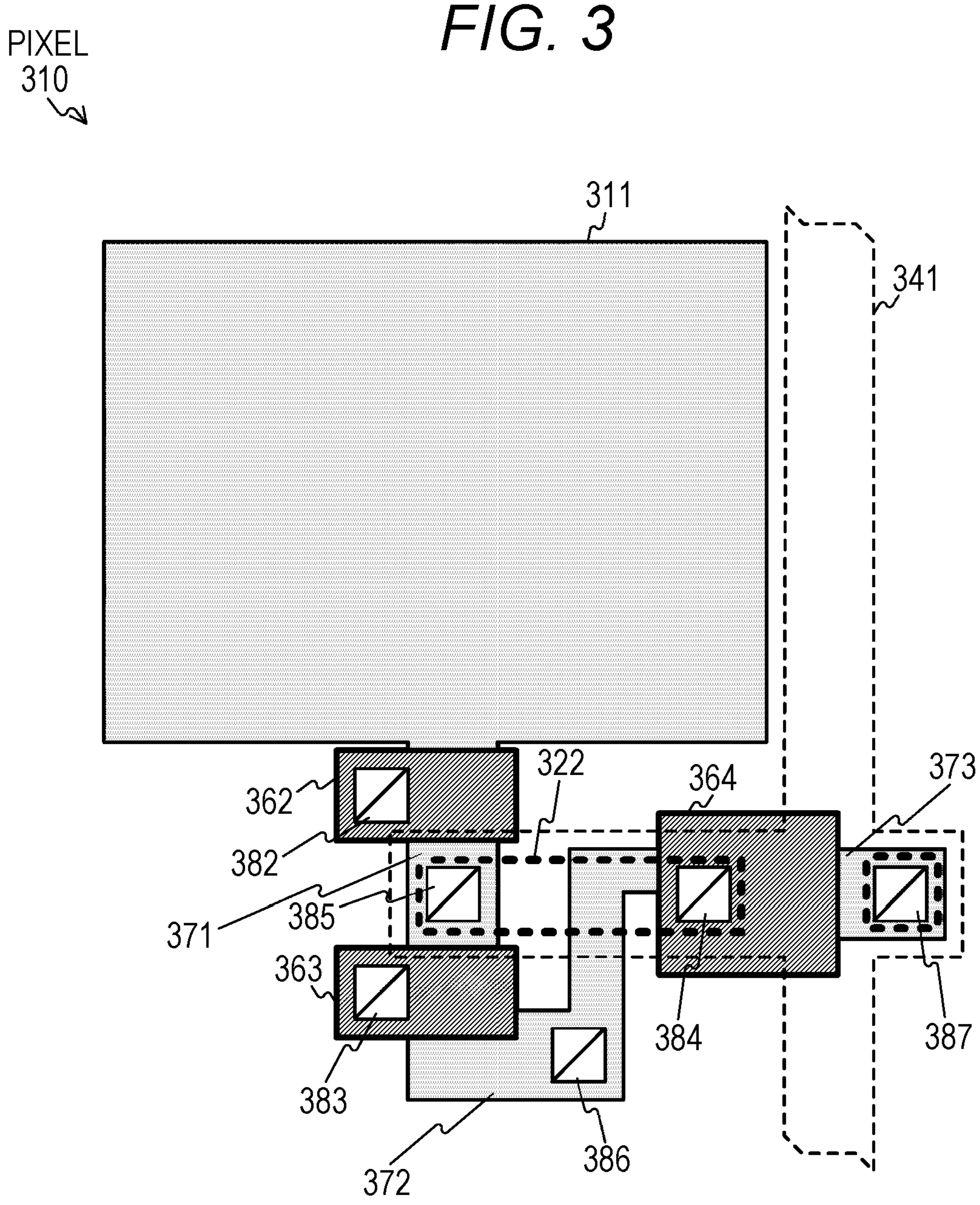
FIG. 3 is a diagram schematically illustrating an example of a layout of the pixel 310 of the first embodiment of the present technology.

FIG. 3 is a diagram schematically illustrating an example of a layout of the pixel 310 of the first embodiment of the present technology.

Here, description will be given focusing on the parasitic capacitance of the gate terminal of the amplifier transistor 314 and the floating diffusion (FD 322).

In the layout of the pixel 310 illustrated in FIG. 3, the photodiode 311, the FD 322, and the vertical signal line 341 are illustrated. Further, in FIG. 3, a wiring of the gate terminal (gate wiring 362) of the transfer transistor 312, a wiring of the gate terminal (gate wiring 363) of the reset transistor 313, and a wiring of the gate terminal (gate wiring 364) of the amplifier transistor 314 are illustrated. Note that the FD 322 is illustrated by a thick broken line, the vertical signal line 341 is illustrated by a thin broken line, and the gate wirings 362 to 364 are illustrated by rectangles with slant lines.

Further, in FIG. 3, an impurity diffusion layer (diffusion layer 371) corresponding to the drain terminal of the transfer transistor 312, the source terminal of the reset transistor 313, and a wiring between these two terminals is illustrated. Further, in FIG. 3, an impurity diffusion layer (diffusion layer 372) corresponding to the drain terminal of the reset transistor 313, the drain terminal of the amplifier transistor 314, and a wiring between these two terminals is illustrated. Further, in FIG. 3, an impurity diffusion layer (diffusion layer 373) corresponding to the source terminal of the amplifier transistor 314 is illustrated. Note that the diffusion layers 371 to 373 are illustrated by rectangles with fine dots.

Further, in this layout, contact (contact 382) for connecting the gate wiring 362 to the charge transfer line 332, and a contact (contact 383) for connecting the gate wiring 363 to the pixel reset line 331 are illustrated. Further, in this layout, a contact (contact 384) for connecting the gate wiring 364 to the FD 322, and a contact (contact 385) for connecting the diffusion layer 371 to the FD 322 are illustrated. Further, in this layout, a contact (contact 386) for connecting the diffusion layer 372 to the power line 323, and a contact (contact 387) for connecting the diffusion layer 373 to the vertical signal line 341 are illustrated.

Here, description will be given about the layout of the pixel 310 focusing on the size of the FD 322. The layout is designed such that the parasitic capacitance in the FD 322 is minimized in the pixel 310. Therefore, the layout is designed such that the FD 322 that is a wiring part connecting the diffusion layer 371 to the gate wiring 364, the diffusion layer 371, and the gate wiring 364 have a minimum area in the pixel 310 as much as manufacturably possible. Further, in the pixel 310, the width in the drain terminal of the amplifier transistor 314 (in the vicinity of the gate wiring 364 of the diffusion layer 373) is narrowed down, and most of the FD 322 is planarly covered by the wiring (vertical signal line 341) connected to the source terminal of the amplifier transistor 314.

An output of a source follower has a gain close to 1 with respect to an input, and thus the substantial parasitic capacitance between the vertical signal line 341 and the FD 322 is very small. Therefore, as illustrated in FIG. 3, with the shield structure in which the FD 322 is covered with the vertical signal line 341, the parasitic capacitance in the FD 322 can be minimized, and the conversion efficiency can be substantially raised.

By making the parasitic capacitance small with the design illustrated in FIG. 3, a sufficiently large output signal can be output to the vertical signal line 341 even if the electrons accumulated in the FD 322 is a few. The magnitude of the output signal may just be sufficiently larger than a random noise of the amplifier transistor 314. If an output signal of when one photon is accumulated in the FD 322 is sufficiently larger than the random noise of the amplifier transistor 314, the signal from the pixel is quantized, and the number of accumulated photons of the pixel can be detected as a digital signal.

For example, when the random noise of the amplifier transistor 314 is about 50 to 100 μV, and the conversion efficiency of the output signal is raised to about 600 μV/$e^-$, the output signal is sufficiently larger than the random noise, detection of one photon is possible in principle.

Note that the pixel 310 as illustrated in FIG. 3 can accumulate a charge of about 1000 $e^-$ in the photodiode 311 when a power source voltage of about 3 V is supplied. The accumulated signal (output signal) in this case is an analog output having a working range of about 0.6 V. Even in this case, the magnitude of the signal per one electron is about ten times larger than a conventional one. Therefore, influence of the random noise on the amplifier transistor 314 and the determination circuit 400 becomes about 1/10. That is, the pixel 310 is suitable for low luminance imaging.

As described above, the output signal of the pixel that includes the photodiode and the amplifier transistor can be treated as binary data and as analog data having a gradation if the conversion efficiency is sufficiently high. However, such a pixel has a problem that an upper limit (dynamic range) of a detected light amount in one imaging is small. To improve the dynamic range, it is effective to increase a reading speed of a signal output by the pixel to increase a frame rate, and then to accumulate a plurality of reading results. For example, in a case where the incidence of the photon is binarily determined, if exposure and reading are performed 1023 times and results are accumulated, data having a gradation in which the dynamic range per one pixel is 10 bits is obtained. Further, in a case where the maximum number of accumulated electrons is 1000 $e^-$, and the number of photons is determined after an analog output, if the exposure and reading are performed 16 times and results are accumulated, data becomes equivalent to an output of the pixel in which the maximum number of accumulated electrons is 16,000 $e^-$.

Next, a function configuration of the determination circuit 400 will be described with reference to FIG. 4.

[An Example of a Function Configuration of the Determination Circuit]

Figure 4:
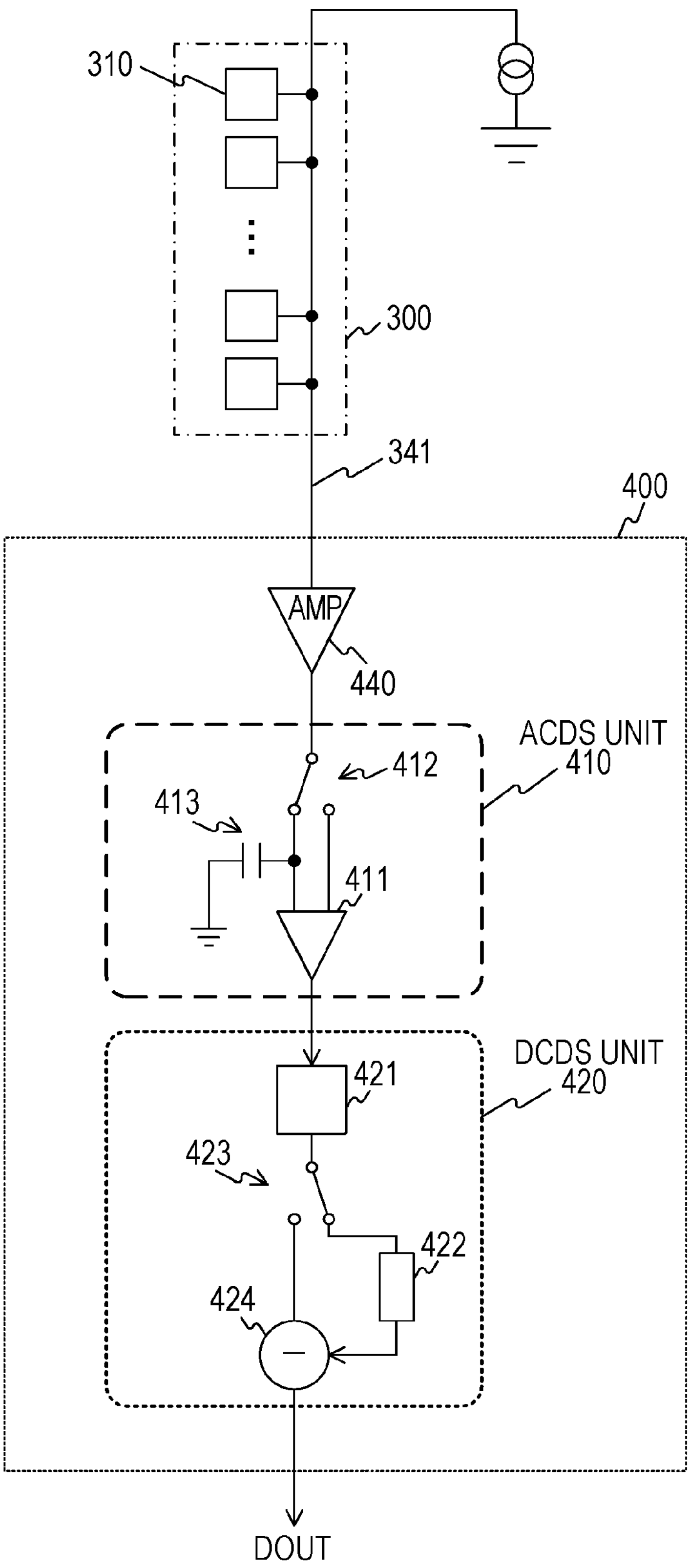
FIG. 4 is a conceptual diagram illustrating an example of a function configuration example of a determination circuit 400 of the first embodiment of the present technology.

FIG. 4 is a conceptual diagram illustrating an example of a function configuration of the determination circuit 400 of the first embodiment of the present technology.

In FIG. 4, as the function configuration of the determination circuit 400, an amplifier unit 440, an analog correlated double sampling (ACDS) unit 410, and a digital correlated double sampling (DCDS) unit 420 are illustrated.

Further, in FIG. 4, the vertical signal line 341 connected to the determination circuit 400, a part of the pixel 310 connected to the vertical signal line 341, and the pixel array unit 300 are illustrated together with the function configuration of the determination circuit 400.

The amplifier unit 440 amplifies a signal output by the pixel 310 by N times (a magnification larger than 1 (N>1)). The amplifier unit 440 is realized by an operational amplifier, for example. That is, in the amplifier unit 440, a difference between an arbitrarily set reference voltage and a signal output by the pixel 310 (a reset signal or an accumulated signal) is amplified and output using resistance division or capacitance division.

Note that the amplifier unit 440 is provided between the pixel 310 and the ACDS unit 410, and thus an offset caused in the pixel 310, such as a kTC noise, is also amplified and output. Further, an output of the amplifier unit 440 includes an offset of the amplifier unit 440 itself. The amplifier unit 440 supplies the amplified signal to the ACDS unit 410. Note that the amplifier unit 440 is an example of an amplifier described in the claims.

The ACDS unit 410 performs offset removal by the analog CDS, and includes a switch 412, a capacitor 413, and a comparator 411.

The switch 412 is a switch for connecting the vertical signal line 341 to either an input terminal that inputs a reference voltage to the comparator 411, or an input terminal that inputs a signal to be compared to the comparator 411. When the reset signal of the pixel 310 is sampled and held, the switch 412 connects the vertical signal line 341 to the input terminal (a left-side terminal to which the capacitor 413 is connected) that inputs the reference voltage. Further, when the comparator 411 outputs a result of the analog CDS, the switch 412 connects the vertical signal line 341 to the input terminal (a right-side terminal having no capacitor) that inputs the signal to be compared.

The capacitor 413 is a holding capacity for sampling and holding the reset signal of the pixel 310.

The comparator 411 outputs a difference between the sampled and held signal and the signal to be compared. That is, the comparator 411 outputs a difference between the sampled and held reset signal, and the signal supplied from the vertical signal line 341 (the accumulated signal or the reset signal). That is, the comparator 411 removes an offset caused in the pixel 310, such as a kTC noise, and an offset of the amplifier unit 440 from the accumulated signal or the reset signal.

Note that, the comparator 411 is realized by an operational amplifier in which the gain is 1, for example. The comparator

411 supplies a signal of the difference to the DCDS unit 420. Note that, here, the signal of the difference between the reset signal and the reset signal is called no signal, and the signal of the difference between the reset signal and the accumulated signal is called net accumulated signal.

The DCDS unit 420 performs offset removal by the digital CDS, and includes an analog digital (AD) conversion unit 421, a register 422, a switch 423, and a subtractor 424. Note that the ACDS unit 410 and the DCDS unit 420 are examples of a calculation unit described in the claims.

The AD conversion unit 421 applies AD conversion to the signal supplied from the comparator 411.

The switch 423 is a switch that switches supply destinations of a signal after AD conversion generated by the AD conversion unit 421. When the AD conversion unit 421 has output a no signal that is a result of the AD conversion (digital no signal), the switch 423 supplies the signal to the register 422, and causes the register 422 to latch (hold) the signal. Accordingly, a value of an offset of the comparator 411 or the AD conversion unit 421 is held in the register 422. Further, when the AD conversion unit 421 has output a net accumulated signal that is a result of the AD conversion (digital net accumulated signal), the switch 423 supplies the signal to the subtractor 424.

The register 422 holds the no signal of the result of the AD conversion. The register 422 supplies the held no signal of the result of the AD conversion (digital no signal) to the subtractor 424.

The subtractor 424 subtracts a value of the digital no signal from a value of the digital net accumulated signal. The subtractor 424 outputs a result of the subtraction (net digital value).

By amplifying the signal output from the pixel 310 by the amplifier unit 440 by N times, a resolution necessary when the AD conversion unit 421 performs the AD conversion can be reduced to 1/N. Especially, by providing the amplifier unit 440 between the pixel 310 and the ACDS unit 410, while the signal of the pixel 310 is amplified by N times before entering the ACDS unit 410, the offset caused in the pixel 310 and the offset of the amplifier unit 440 can be removed in the ACDS unit 410. That is, the AD conversion unit 421 applies the AD conversion to the signal from which the offset of the pixel 310 and the offset of the amplifier unit 440 have been removed, whereby the offset component of when the AD conversion is performed can be minimized.

That is, compared with a determination circuit that does not include the amplifier unit 440, the resolution of the AD conversion can be just 1/N and the amount of the offset component at the time of the AD conversion is the same, and thus a necessary time for the AD conversion can be reduced. Especially, when the AD conversion is applied to the no signal, the no signal with the minimized offset component is subjected to the AD conversion with the 1/N resolution, and thus the necessary time can be substantially reduced. Note that the offset component that configured the no signal here is the offset component caused in the ACDS unit 410 and the offset component caused in the DCDS unit 420.

Further, when very small light is detected such as one photon detection using the imaging element 100, most of the accumulated signal from the pixel 310 becomes a no signal (offset), and further, in the case of one photon detection, an amount to count for the output signal of the pixel 310 (potential difference) becomes very small. Therefore, the AD conversion time for the output signal of the pixel 310 is very short. That is, the time required for the AD conversion can be substantially reduced.

Note that, if an amplifier that amplifies a signal output from a pixel is provided in an ordinary imaging element that generates multi gradation data, variation of the gains of the amplifier unit 440 is reflected in a final output as it is, and a vertical stripe of each column appears. However, when existence of incidence of one photon to a pixel is binarily determined using weak light as light to be detected, a determination threshold for identifying the number of photons "0" and the number of photons "1" is appropriately provided, whereby the influence of the variation of the gains can be filtered and completely eliminated. That is, the imaging element 100 is an imaging element especially suitable for the binary determination of a one-photon signal.

Note that, in the determination circuit 400 illustrated in FIG. 4, the comparator 411 and the AD conversion unit 421 may be integrated, and the CDS may be performed with an auto zero operation. An example of a circuit configuration of such a determination circuit 400 will be described with reference to FIG. 5.

[An Example of a Circuit Configuration of the Determination Circuit]

Figure 5:
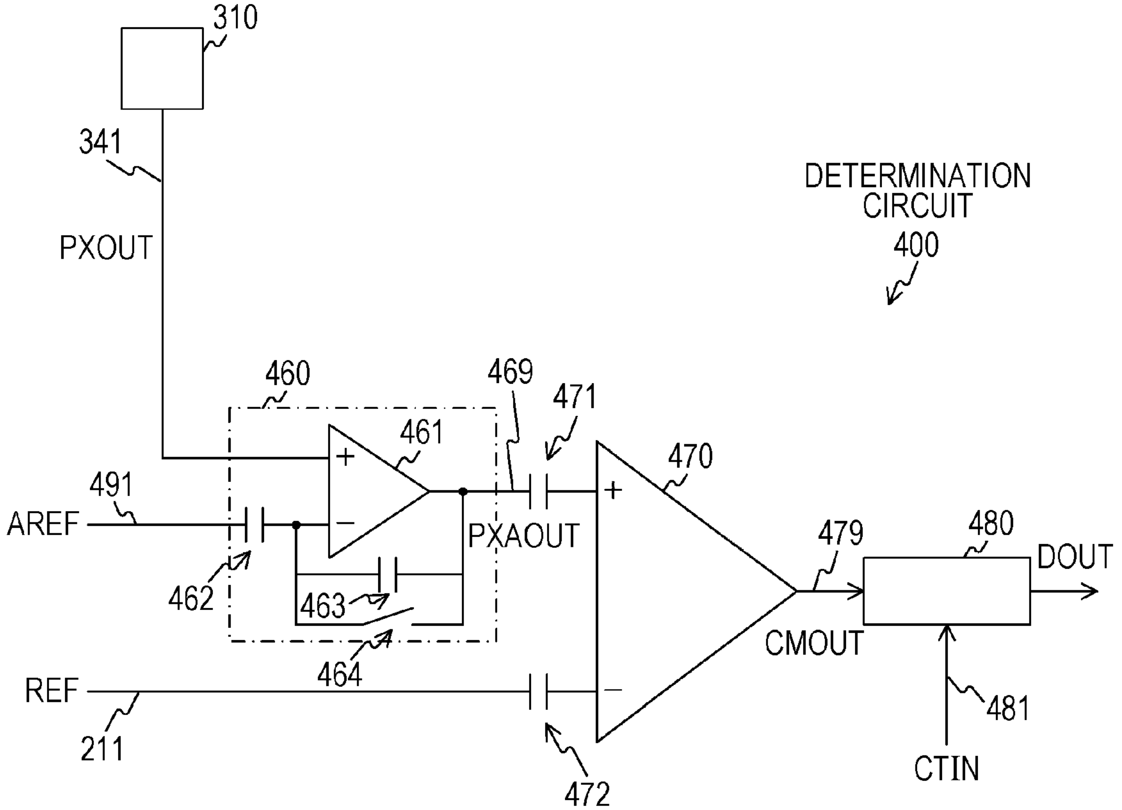
FIG. 5 is a diagram schematically illustrating an example of a circuit configuration example of the determination circuit 400 of the first embodiment of the present technology.

FIG. 5 is a diagram schematically illustrating an example of a circuit configuration of the determination circuit 400 of the first embodiment of the present technology.

In FIG. 5, as the circuit configuration of the determination circuit 400, an amplifier circuit 460, a comparator 470, capacitors 471 and 472, and a counter 480 are illustrated. Further, in FIG. 5, the vertical signal line 341 connected to the determination circuit 400 and a part of the pixel 310 connected to the vertical signal line 341 are illustrated together.

The amplifier circuit 460 includes an amplifier 461, capacitors 462 and 463, and a switch 464.

In the amplifier 461, a positive input terminal (+ terminal) is connected to the vertical signal line 341, and a negative input terminal (− terminal) is connected to one electrode of the capacitor 462, one electrode of the capacitor 463, and the switch 464. Further, in the amplifier 461, an output terminal is connected to one electrode of the capacitor 471, the other electrode of the capacitor 463, and the switch 464.

Further, in the capacitor 471, the other electrode is connected to a positive input terminal (+ terminal) of the comparator 470. In the capacitor 472, one electrode is connected to the REF signal line 211, and the other electrode is connected to a negative input terminal (− terminal) of the comparator 470. Further, an output terminal of the comparator 470 is connected to the counter 480.

Here, the amplifier circuit 460 will be described. The amplifier circuit 460 amplifies a signal (illustrated by "PXOUT" in FIG. 5) supplied from the pixel 310 through the vertical signal line 341 by N times (N>1). That is, the amplifier circuit 460 corresponds to the amplifier unit 440 in the example of a function configuration illustrated in FIG. 4. Therefore, the amplifier circuit 460 is an example of the amplifier described in the claims.

First, the amplifier circuit 460 causes the potential at the + terminal to be a predetermined intermediate potential, and then causes the switch 464 to be in a conductive state and performs an auto zero operation. This enables the potential at the − terminal to be the same as the potential at the + terminal. Then, the amplifier circuit 460 causes the switch 464 to be in a non-conductive state, and then amplifies a signal to be supplied to the + terminal. In this amplification, a difference between the potential at the − terminal (intermediate potential) and the potential at the + terminal is amplified by N times (N>1), and is forwardly (not inversely) output using the capacitance division.

Note that, in the first embodiment of the present technology, the auto zero operation of the amplifier circuit 460 is executed such that the potential of the reset signal of the pixel 310 is caused to be the intermediate potential, and the auto zero operation is executed at the same time as the amplification of the reset signal at a timing when the pixel 310 outputs the reset signal. In this case, an offset component (an offset component of the pixel 310) caused in the pixel 310 is offset by the auto zero operation. However, the signal (illustrated by "PXAOUT" in FIG. 5) output from the output terminal of the amplifier circuit 460 includes an offset component unique to the amplifier circuit 460. This offset component is a switching noise generated at the – terminal side by a feedthrough of the switch 464 at completion of the auto zero operation, or a kTC noise of the amplifier circuit 460. This offset is amplified by N times, similarly to the signal, at the amplification of the signal (PXOUT) of the pixel 310. That is, the signal (PXAOUT) output from the output terminal of the amplifier circuit 460 includes a considerably large offset component.

The capacitors 471 and 472 are capacitors with equal capacity provided in the + terminal and the – terminal of the comparator 470. In these capacitors 471 and 472, a charge for performing the ACDS is held in the electrode (the other electrode) of the capacitor 471 at the + terminal side of the comparator 470 and the electrode (the other electrode) of the capacitor 471 at the – terminal side of the comparator 470. Accordingly, the offset component of the pixel 310 and the offset component of the amplifier circuit 460 are eliminated (offset) from the PXAOUT, and then comparison of the potential of the PXAOUT and the potential of the REF by the comparator 470 is performed. For example, when the charge of the reset signal is held in the capacitors 471 and 472, and the reset signal is supplied to the + terminal of the comparator 470, a signal (no signal) from which the charge of the reset signal is supplied to the + terminal of the comparator 470. Note that, in the first embodiment of the present technology, the offset component generated in the pixel 310 when the auto zero operation of the amplifier circuit 460 is performed using the potential of the reset as the intermediate potential is offset, and thus only the offset component of the amplifier circuit 460 is offset.

The comparator 470 compares the potential at the + terminal (the potential of the PXAOUT) and the potential at the – terminal (the potential of the REF signal), and outputs a signal according to the terminal at which a higher potential is caused. For example, when the potential at the + terminal is higher than the potential of the REF signal (referred to as "REF"), the comparator 470 outputs a signal having the highest potential (referred to as H level). When the potential of the PXAOUT is lower than the potential of the REF, the comparator 470 outputs a signal having the lowest potential (referred to as L level). The comparator 470 performs the comparison twice at the time when the potential at the + terminal is the potential of the reset signal, and at the time when the potential of the + terminal is the potential of the accumulated signal. When the potential at the + terminal is the potential of the reset signal, the comparator 470 supplies a signal of a comparison result (described as "CMOUT") to the counter 480.

The counter 480 performs count for generating a digital value based on a signal of the comparison result (CMOUT) of the comparator 470, and a clock signal (CTIN) supplied from the clock signal line 481. When performing the count of the reset signal, the counter 480 performs down count from an initial value (for example, "0"). The counter 480 then performs up count from a count value that is a result of the down count when performing count of the accumulated signal. The up count from the count value that is a result of the down count corresponds to the subtraction of the subtractor 424 illustrated in FIG. 4. The counter 480 outputs a signal (DOUT) indicating a digital value of a result of the up count. Note that the counter 480 and the comparator 470 correspond to the DCDS unit 420 in the example of a function configuration illustrated in FIG. 4. Further, the capacitors 471 and 472 correspond to the ACDS unit 410 in the example of a function configuration illustrated in FIG. 4. That is, the capacitors 471 and 472, the comparator 470, and the counter 480 are examples of a calculation unit described in the claims. Further, the capacitors 471 and 472 are examples of a holding unit described in the claims, the comparator 470 is an example of a comparison unit described in the claims, and the counter 480 is an example of a count unit described in the claims.

Here, the comparison performed by the comparator 470, and the count by the counter 480 will be described. The comparison by the comparator 470 is performed to digitalize the reset signal and the accumulated signal. Therefore, when the comparison is performed, the potential of the REF signal supplied from the REF signal generation unit 210 through the REF signal line 211 is caused to be a ramp wave. Further, in a period in which the potential of the REF signal is caused to be a ramp wave, pulses corresponding to steps of the ramp wave one to one are supplied to the clock signal. The pulses are supplied in synchronization with a start timing of the ramp wave, and the counter 480 counts the number of pulses from the start of the ramp wave to a timing at which the signal of the comparison result of the comparator 470 is inverted (transition is performed from the L level to the H level), and generates a digital value.

Note that the amount of descending potential of each step of the ramp wave (a potential difference of a step difference) is set to an amount according to a gradation of when the accumulated signal is converted to a digital value. That is, the potential difference of a step difference is N times larger than that of an imaging element (another imaging element) that does not include the amplifier circuit 460, similarly to the amplification magnification.

Further, when the reset signal is digitally determined (in the reset signal count period (see FIG. 6)), the offset components of the pixel 310 and the amplifier 461 have been already canceled by the ACDS. Therefore, in the digital determination of the reset signal, only the offset component of the comparator 470 itself is digitally determined. Note that the magnitude of the offset component of the comparator 470 itself is not amplified by the amplifier circuit 460, and thus the same as the imaging element that does not include the amplifier circuit 460 (another imaging element). Therefore, the potential difference (the potential difference to be scanned (see the potential difference D1 of FIG. 6)) from the start of the ramp wave (the start of scanning) of the reset signal count period in the imaging element 100 to the end (the end of scanning) is the same as that of the imaging element that does not include the amplifier circuit 460 (another imaging element).

Next, an example of a timing chart illustrating an operation of the determination circuit 400 illustrated in FIG. 5 will be described with reference to FIG. 6.

[An Example of a Timing Chart]

Figure 6:
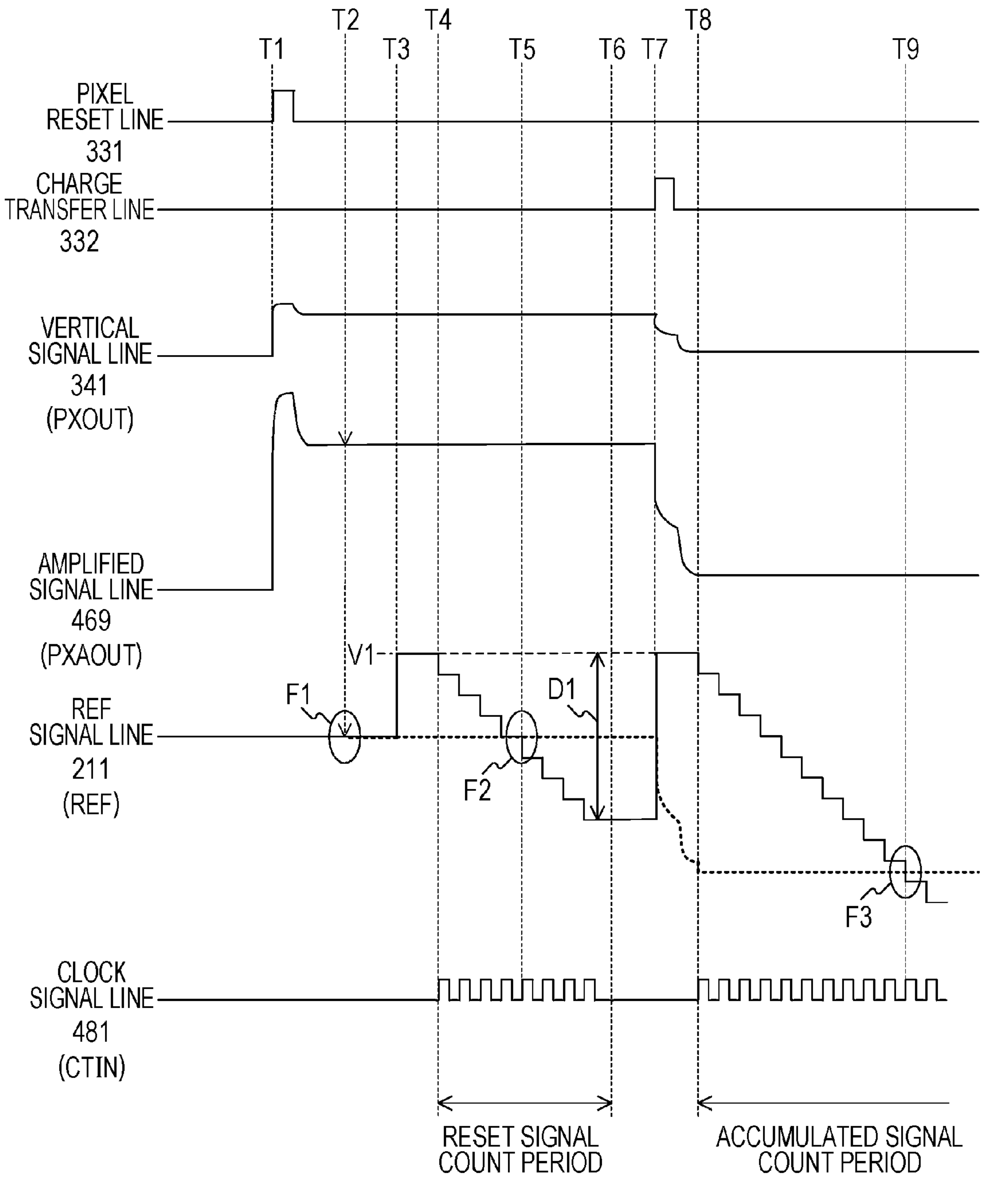
FIG. 6 is a timing chart illustrating an example of an operation of the determination circuit 400 of the first embodiment of the present technology.

FIG. 6 is a timing chart illustrating an example of an operation of the determination circuit 400 of the first embodiment of the present technology.

Here, the horizontal axis is a common time axis, and potential changes of the pixel reset line 331, the charge transfer line 332, the vertical signal line 341, an amplification signal line 469, the REF signal line 211, and the clock signal line 481 are illustrated by the solid lines. Further, here, to compare and describe the potential change in the amplification signal line 469 and the potential change in the REF signal line 211, the potential change in the amplification signal line 469 at a timing T2 and subsequent timings is illustrated by the broken line superimposed on the REF signal line 211. Note that the length of the time axis is schematically illustrated, and does not indicate a ratio of a time length of each timing.

In FIG. 6, for convenience of description, illustration is made to the middle of a period in which the digital determination of the accumulated signal is performed (the accumulated signal count period), and description will be given. Further, in FIG. 6, description will be given focusing on predetermined timings (timings from T1 to T8) of transition of the operation from when the reset signal is output from the pixel 310 to when the digital value (net digital value) of the accumulated signal becomes clear. Note that the description will be given assuming that the amplifier circuit 460 amplifies a signal by four times and outputs the signal in FIG. 6.

First, at the timing T1, the reset pulse is supplied to the gate terminal of the reset transistor 313 of the pixel 310 through the pixel reset line 331. Accordingly, the signal of the reset level (reset signal) is supplied to the vertical signal line 341, and the potential of the vertical signal line 341 is made transition to the potential of the reset signal. Note that the transition of the potential in the vertical signal line 341 is amplified by four times by the amplifier circuit 460, and is output to the amplification signal line 469. That is, a transition amount (potential difference) of the potential of the amplification signal line 469 at the timing T1 is four times the potential difference in the vertical signal line 341. Note that, at the timing T1, the auto zero operation of the amplifier circuit 460 is performed using the potential of the reset signal of the pixel 310 as the intermediate potential.

When the reset signal that has risen at the timing T1 falls, the potential of the vertical signal line 341 also slightly falls due to influence of coupling. Further, the potential in the amplification signal line 469 also falls by about four times the transition amount (potential difference) of the potential of the vertical signal line 341. Note that the potential of the amplification signal line 469 that becomes stable after falling due to the influence of coupling is used in the determination circuit 400 as the potential of the reset signal amplified by four times.

Next, at the timing T2, the charge for performing the analog CDS is held in the capacitor 471 connected to the + terminal of the comparator 470 and the capacitor 472 connected to the – terminal of the comparator 470. This holding of the charge is performed such that, in an operation (auto zero operation) to determine a determination reference voltage of the comparator 470, the voltages applied to the + terminal and the – terminal of the comparator 470 are balanced by ON/OFF of the transistor inside the comparator 470, and the balanced voltages are respectively held (for example, see JP 2008-193373 A). When the auto zero operation is completed, the potential of the reset signal supplied to the + terminal of the comparator 470 becomes a potential of a relative reference signal (the frame F1 of FIG. 6) and can be considered as a no signal. Note that the holding of the charge at the timing T2 corresponds to the sampling and holding of the reset signal described in FIG. 4.

Then, at the timing T3, the potential of the REF signal line 211 is made transition to a potential (V1) at the start of the ramp wave. Note that, the REF signal line 211 is shared by a plurality of comparators 470 (see FIG. 1), the potential difference made transition at the timing T3 is shared by the plurality of comparators 470. Therefore, as the potential difference of the REF signal line 211, a potential difference in which the potential of the REF signal accords with the potential of the reset signal in the middle of the ramp wave in all of the comparators 470 is set. That is, the potential difference of the REF signal line 211 is set such that the potential of a signal input from the + terminal of the comparator 470 can deal with an offset that rises the most among offsets that vary depending on the comparators 470 (the offsets can be included in the potential).

Next, at the timing T4, supply of the step-like pulses to the REF signal line 211 is started, and a period in which the reset signal output from the pixel 310 is counted (reset signal count period) is started. That is, at the timing T4, a first step-like pulse is supplied to the REF signal line 211. Further, at the timing T4, supply of a pulse synchronized with the step-like pulse is started in the clock signal line 481. Further, in the counter 480, the down count is started according to the number of pulses of the clock signal line 481. Note that this down count is started from an initial value (for example, "0") of the value (count value) counted by the counter 480. This down count is performed until the signal (CMOUT) output from the comparator 470 is inverted.

Then, at the timing T5, when the potential of the – terminal of the comparator 470 becomes lower than the potential of the + terminal of the comparator 470, the output signal (CMOUT) of the comparator 470 is inverted and the down count of the counter 480 is stopped. That is, at the timing at which the relationship between the potentials of the + terminal and the – terminal of the comparator 470 is inverted (the frame F2 of FIG. 6), the count is stopped. The count value counted in the down count is held until the count of the accumulated signal. Note that the count value generated by the down count corresponds to the result of the AD conversion of the no signal (digital no signal) described in FIG. 4. That is, the count value generated by the down count corresponds to the value obtained by digitalizing the offset component of the comparator 470.

Then, at the timing T6, when a predetermined number of steps has been completed, and the ramp wave for counting the reset signal has been completed, the reset signal count period ends. Note that the potential difference to be scanned (the potential difference D1 of FIG. 6) from the start to the end of the ramp wave in the reset signal count period is set to be able to deal with an offset in which the potential rises the most and an offset in which the potential falls the most among the offsets that vary depending on the comparators 470. Further, the potential difference D1 is set such that unnecessary steps can be reduced as much as possible in order to make the time length of the reset signal count period short.

Then, at the timing T7, the potential of the REF signal is made transition to the potential (V1) at the start of the ramp wave. That is, the potential is returned to the same state as the timing T3, and the potential of the output signal (CMOUT) of the comparator 470 is returned to the potential that is counted by the counter 480. Further, at the timing T7, a transfer pulse is supplied to the gate terminal of the transfer transistor 312 of the pixel 310 through the charge transfer line 332. Accordingly, a signal (accumulated signal) according to the accumulated charge is supplied to the vertical signal line 341. Then, the potential of the vertical signal line 341 is made transition to a potential according to the accumulated signal.

Note that, similarly to the timing T1, the transition of the potential in the vertical signal line 341 is amplified by four times by the amplifier circuit 460. Further, similarly to the falling of the reset pulse at the timing T1, when the transfer pulse rises, the potentials of the amplification signal line 469 and the vertical signal line 341 slightly fall due to the influence of coupling. Note that the potential that becomes stable after falling due to the influence of coupling is used in the determination circuit 400 as the potential of the accumulated signal amplified by four times.

Next, at the timing T8, supply of the step-like pulse to the REF signal line 211 is started, and a period in which the accumulated signal output from the pixel 310 is counted (accumulated signal count period) is started. Further, similarly to the timing T4, a pulse synchronized with the step like pulse is supplied to the clock signal line 481. Note that, during the accumulated signal count period, the counter 480 performs up count, and the count is performed until the output signal (CMOUT) of the comparator 470 is inverted. Note that the up count is started from the count value that is the result of the down count in the reset signal count period.

Then, at the timing T9, when the potential of the – terminal of the comparator 470 becomes lower than the potential of the + terminal of the comparator 470 (the frame F2 of FIG. 6), the output signal (CMOUT) of the comparator 470 is inverted, and the up count of the counter 480 is stopped and the count value is held. Then, the held count value is output as a result of the digital determination of the accumulated signal of the pixel 310 (pixel value).

Note that the held count value corresponds to the subtraction result (net digital value) of the subtractor 424 described in FIG. 4. That is, the count value subjected to the up count from the result of the down count and held is a net pixel value in which the offset component of the pixel 310, the offset component of the amplifier circuit 460, and the offset component of the comparator 470 have been offset.

Here, description will be given focusing on the offset components (the offset component caused in the pixel 310, the offset component caused in the amplifier circuit 460, and the offset component caused in the comparator 470). At the timing T1, when the auto zero operation of the amplifier circuit 460 is performed using the potential of the reset signal of the pixel 310 as the intermediate potential, the offset component caused in the pixel 310 is offset by the auto zero operation of the amplifier circuit 460. However, the signal of the amplification signal line 469 includes the offset component caused in the amplifier circuit 460. The offset component caused in the amplifier circuit 460 is offset by the analog CDS operation at the timing T2.

Note that, in the analog CDS operation at the timing T2, the offset component caused in the comparator 470 (the offset exists in the comparator 470, the kTC noise generated associated with the auto zero operation of the comparator 470, the feedthrough, and the like) has not been offset. However, the offset component caused in the comparator 470 is offset by the digital CDS by the down count of the reset signal and the up count of the accumulated signal.

Next, the amplification by the amplifier circuit 460 and the count of the reset signal will be described. As described in FIG. 6, the potential differences of the steps of the ramp wave becomes four times because the signal from the pixel 310 is amplified by four times by the amplifier circuit 460. That is, the accuracy of the resolution of the AD conversion can be ¼, compared with an imaging element (another imaging element) that does not include the amplifier circuit 460.

Further, the potential difference is four times, and thus the inclination of the slope in the ramp wave becomes four times. Further, as described in FIG. 5, the potential difference (the potential difference D1 of FIG. 6) from the start to the end of the ramp wave in the reset signal count period is the same as another imaging element. Since the potential difference is scanned with the four-time inclination, the time length of the reset signal count period in the imaging element 100 becomes ¼ of another imaging element.

Here, the potential difference from the start to the end of the ramp wave in the accumulated signal count period (the potential difference to be scanned in the accumulated signal count period) will be described. The potential difference is set such that transition of the potential obtained by adding the offset component caused in the comparator 470 and the accumulated signal can be detected. That is, the potential difference to be scanned in the accumulated signal count period is a potential difference obtained by adding the potential difference D1 in the reset signal count period and the potential difference for detection of the accumulated signal. The potential difference for detection of the accumulated signal becomes N times the potential difference of an imaging element (another imaging element) that does not include the amplifier circuit 460 because the output signal of the pixel 310 is N times. Meanwhile, the potential difference D1 in the reset signal count period is the same as that of another imaging element. That is, the percentage of the time that becomes ¼ times becomes higher as the detection time of the offset component of the comparator 470 is longer in the accumulated signal count period, and the time length of the accumulated signal count period becomes shorter than that of another imaging element.

The imaging element (imaging element 100) of the first embodiment of the present technology is an imaging element for detecting weak light, and thus the accumulated signal is very small. That is, in the time length of the accumulated signal count period, the percentage of the detection time of the offset component of the comparator 470 is very large.

That is, by providing the amplifier circuit 460, the detection time of the offset component of the comparator 470 that takes up most of the time required for the AD conversion to detect the weak light can be substantially shortened.

Next, differences between the reset signal count period in the imaging element 100 and the reset signal count period in another imaging element will be described.

[An Example of Differences of the Reset Signal Count Periods]

FIGS. 7*a* and 7*b* are diagrams schematically illustrating a reset signal count period of the imaging element 100 of the present technology, and a reset signal count period of another imaging element.

FIG. 7*a* illustrates a potential change of a line (REF signal line 599) that supplies an REF signal of another imaging element in the reset signal count period, and FIG. 7*b* illustrates a potential change of the REF signal line 211 of the imaging element 100 of the first embodiment of the present technology. Note that the potential change illustrated in FIG. 7*b* is similar to the potential change described in FIG. 6, and thus description here is omitted.

As illustrated in FIGS. 7*a* and 7*b*, the potential difference to be scanned (the potential difference D1) is the same in another imaging element and in the imaging element 100. Meanwhile, the potential difference of the step of the ramp wave of the imaging element 100 is N times the potential difference of another imaging element. Therefore, the time length of the reset signal count period of the imaging element 100 (the reset signal count period (the imaging element 100)) is 1/N times the time length of another imaging element (the reset signal count period (another imaging element).

Next, a table that summarizes differences between the ramp wave in the imaging element 100 and the ramp wave in another imaging element will be described with reference to FIGS. 8*a* and 8*b*.

[An Example of Differences Between the Ramp Waves]

FIGS. 8*a* and 8*b* are tables for comparing a ramp wave of a REF signal in the imaging element 100 of the first embodiment of the present technology, and a ramp wave of a REF signal in another imaging element.

Note that, in FIGS. 8*a* and 8*b*, description will be given assuming that a signal generated by the pixel 310 is amplified by N times by the amplifier circuit 460 using the ramp wave in another imaging element as a reference (illustrated as "×1" in FIGS. 8*a* and 8*b*).

Figure 7:
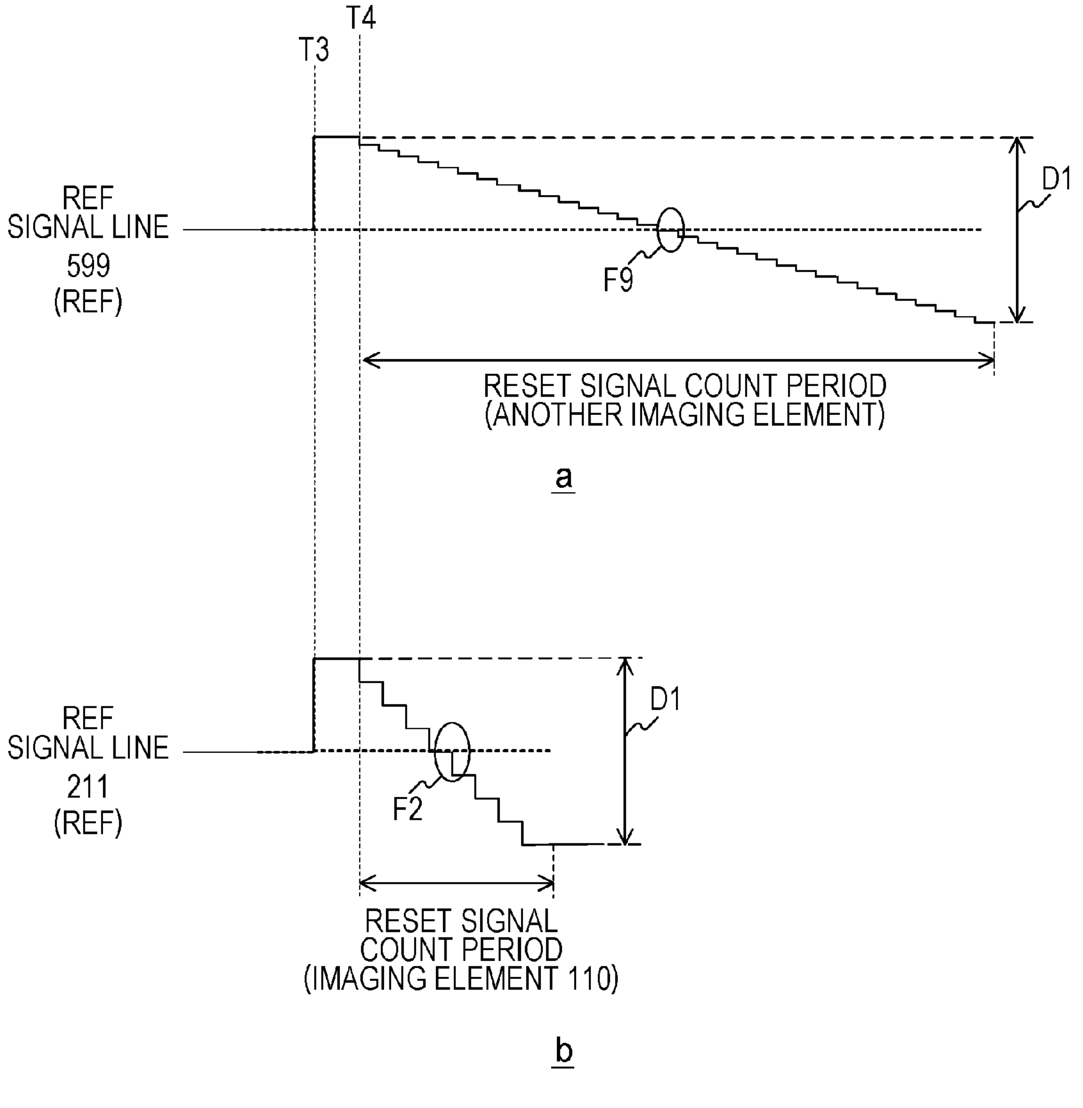
FIGS. 7*a* and 7*b* are diagrams schematically illustrating a reset signal count period of the imaging element 100 of the present technology, and a reset signal count period of another imaging element.

Note that the details of the ramp wave in the imaging element 100 have been described in FIGS. 5 to 7, and thus description here will be simply given.

FIG. 8*a* illustrates a table for comparing the ramp waves in the reset signal count periods.

As illustrated in the table of FIG. 8*a*, regarding the potential difference of the step of the ramp wave of the REF signal, the potential difference that is N times (×N) the potential difference (×1) of another imaging element is set in the imaging element 100.

Further, regarding the potential difference to be scanned in the reset signal count period (the difference between the potentials of the start and the end of the ramp wave in the reset signal count period), the potential difference (×1) that is the same as the potential difference to be scanned (×1) of another imaging element is set to the imaging element 100.

Note that, regarding the number of steps in the reset signal count period, the number of steps that is 1/N times (×1/N) the number of steps (×1) of another imaging element is set to the imaging element 100.

That is, the time length of the reset signal count period in the imaging element 100 is 1/N times (×1/N) the time length of another imaging element.

The table of FIG. 8*b* illustrates a table for comparing the ramp waves in the accumulated signal count periods.

The potential difference of the step of the ramp wave of the REF signal in the accumulated signal count period is similar to that of the reset signal count period.

The potential difference to be scanned in the accumulated signal count period is (×1) that is the same as that of another imaging element, in relation to a portion corresponding to the potential difference for detecting the offset component of the comparator 470. Meanwhile, a portion corresponding to the potential difference for detecting the accumulated signal is N times (×N) the potential difference in another imaging element. That is, the potential difference to be scanned in the accumulated signal count period is closer to the potential difference of another imaging difference as the percentage of the potential difference for detecting the offset component of the comparator becomes larger in the potential difference to be scanned in the accumulated signal count period.

Further, the number of steps in the accumulated signal count period is 1/N times of another imaging element, in relation to a portion corresponding to the number of steps for detecting the offset component of the comparator 470. Meanwhile, a portion corresponding to the number of steps for detecting the accumulated signal is (×1) that is the same as the number of steps in another imaging element.

Further, the time length of the accumulated signal count period is 1/N times of another imaging element, in relation to a portion corresponding to the time length for detecting the offset component of the comparator 470. Meanwhile, a portion corresponding to the time length for detecting the accumulated signal is (×1) that is the same as the time length of another imaging element.

That is, the time length of the accumulated signal count period becomes shorter as the percentage of the time length for detecting the offset component of the comparator 470 becomes larger in the time length of the accumulated signal count period.

As described above, by providing the amplifier circuit 460, the time required for the AD conversion of the offset component of the comparator 470 can be made shorter.

Figure 10:
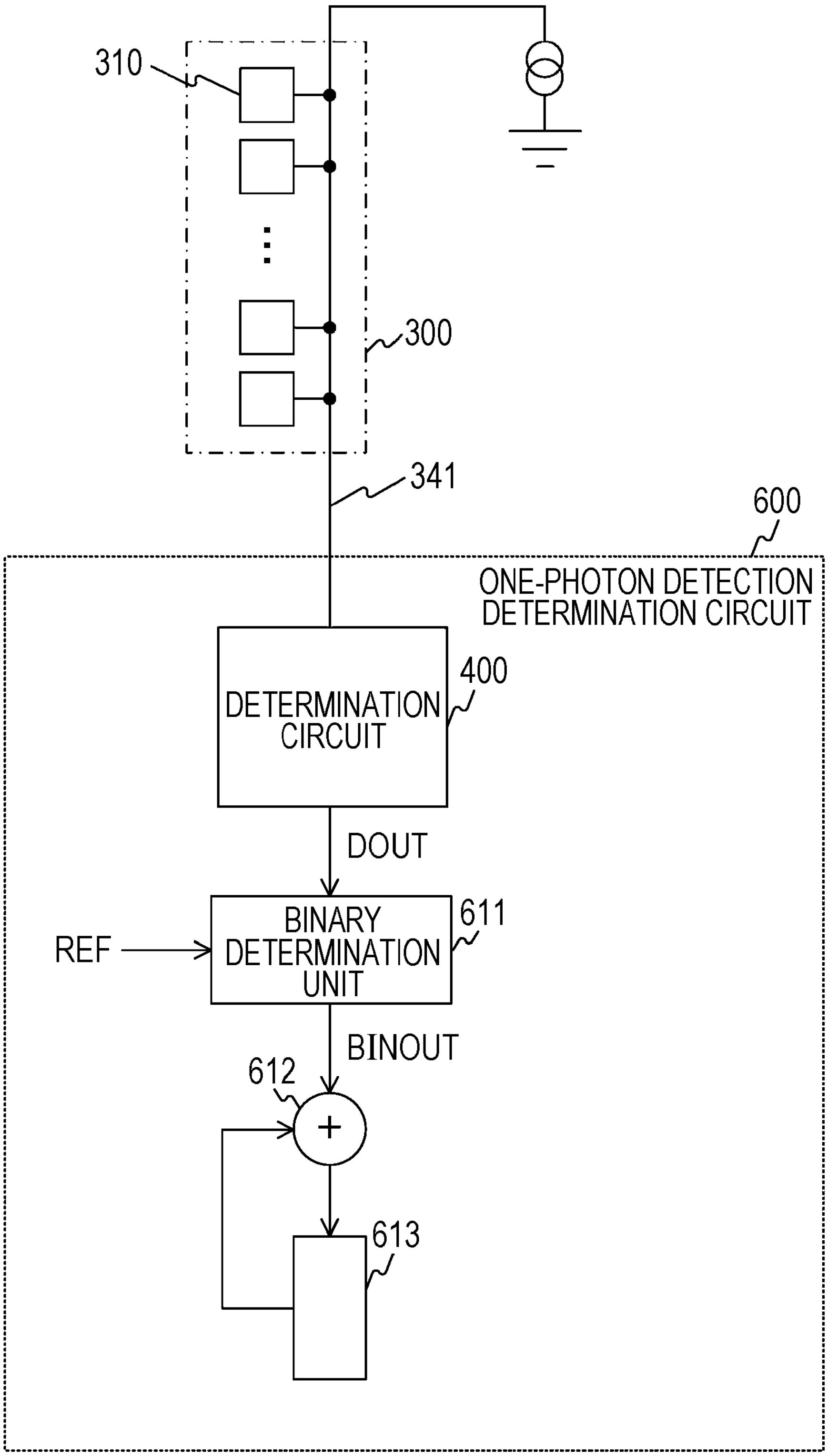
FIG. 10 is a conceptual diagram illustrating an example of a function configuration example of a determination circuit for detecting one photon (one-photon detection determination circuit 600) of a second embodiment of the present technology.
Figure 11:
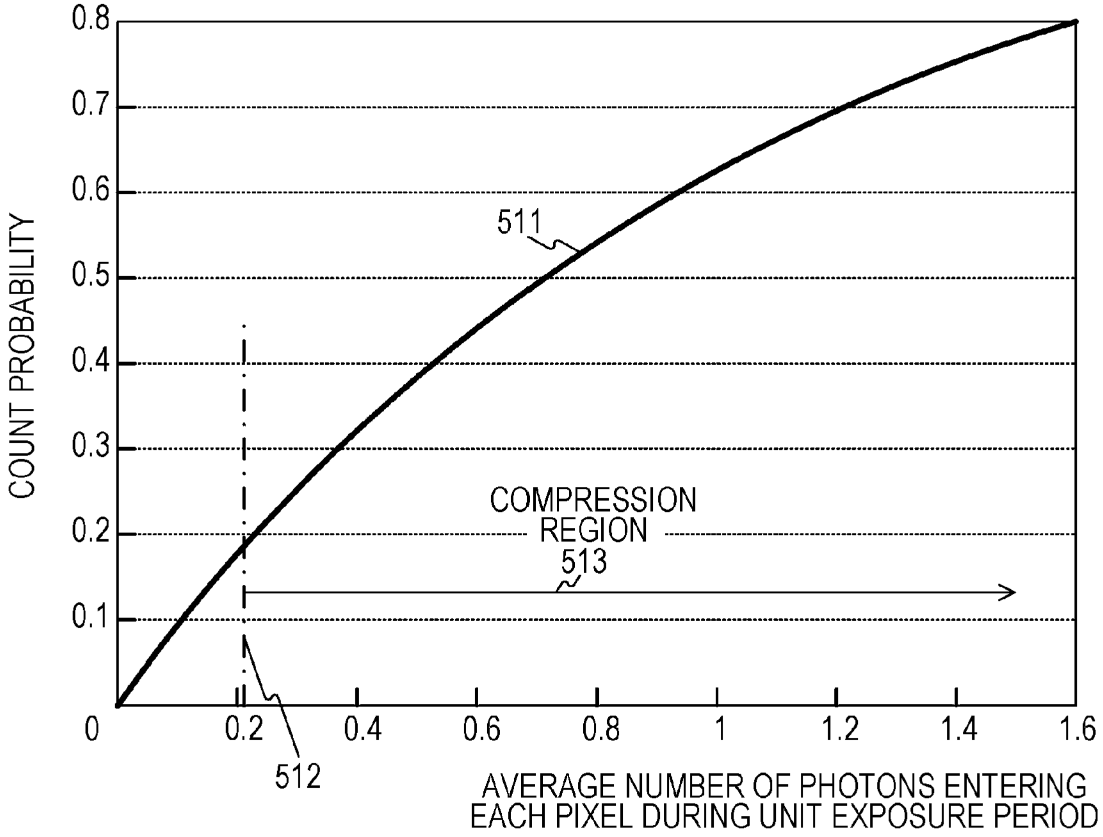
FIG. 11 is a graph illustrating a relationship between an average number of photons incident on each pixel during a unit exposure period and a count probability in the second embodiment of the present technology.

Here, the shortening of the time required for the AD conversion of the offset component of the comparator 470 by providing the amplifier circuit 460 will be described in consideration of a value of the offset of the comparator. Note that, here, description will be given assuming that the conversion efficiency in the pixel 310 is 600 μV/e$^-$, and the offset of the comparator 470 is several mV to several tens of mV. Note that, for convenience of description, the description will be given assuming that existence of incidence of one photon to a pixel is binarily determined, like a second embodiment of the present technology below (FIGS. 10 and 11).

First, description will be given assuming that there is no amplifier circuit 460. A determination threshold of when existence of incidence of one photon is binarily determined is about 300 μV that is an intermediate value from 0 to 600 μV if the offset of the comparator 470 is not considered. Therefore, when the offset of the comparator 470 is not considered, the existence of incidence of one photon can be binarily determined if the ramp wave of the REF signal covers the determination threshold up to about 300 μV.

However, the offset of the comparator 470 is several mV to several tens of mV, and the range of the offset of the comparator 470 (several mV to several tens of mV) is large by more than one digit, considering the range of the output signal of the pixel 310 (0 to 600 μV). Offsetting of the offset of the comparator 470 is performed such that the portion corresponding to the offset component (the value of the down count in the reset signal count period) is subtracted from the count value in the accumulated signal count period, as illustrated in FIGS. 6 and 7.

That is, a step (detection accuracy) of the ramp wave for detecting the output signal of the pixel 310 and a step (detection accuracy) of the ramp wave for detecting the offset component of the comparator 470 need to be the same. When a signal amount of one photon is S (μV), and if the AD conversion is not conducted with a step of the ramp wave that is sufficiently smaller than S/2 μV, the output signal of the pixel 310 is buried in a quantization error of the offset component of the comparator 470. That is, if the AD conversion is not conducted with a step of the ramp wave, which is equal to or less than ½ the signal amount generated by one photon, the resolution of the AD conversion becomes insufficient.

To perform the AD conversion of two values having a more than one digit difference (the offset of the comparator 470, and the output signal of the pixel 310) with the same detection accuracy, most of the reset signal count period and the accumulated signal count period in the determination of one-photon incidence is a detection time of the offset of the comparator 470.

In such a case, if the amplifier circuit 460 that amplifies the output signal from the pixel 310 by four times before entering the comparator 470 is provided, the range of the output signal of the pixel 310 (0 μV to 600 μV) becomes four times (0 μV to 2400 μV). Further, the detection accuracy that is 300 μV (S/2 μV) becomes sufficient by ¼ detection accuracy (1200 μV). Note that, as described in FIG. 6, the range of the offset of the comparator 470 (several mV to several tens of mV mV) does not change.

That is, by providing the amplifier circuit 460, the step of the ramp wave can be made larger (the detection accuracy cam be decreased). That is, only the resolution to the offset component of the comparator 470 can be decreased without decreasing the resolution to the output signal of the pixel 310 (the detection accuracy with which the existence of incidence of one photon can be detected).

[An Operation Example of an Imaging Element]

Next, an operation of the imaging element 100 in the first embodiment of the present technology will be described with reference to the drawing.

Figure 9:
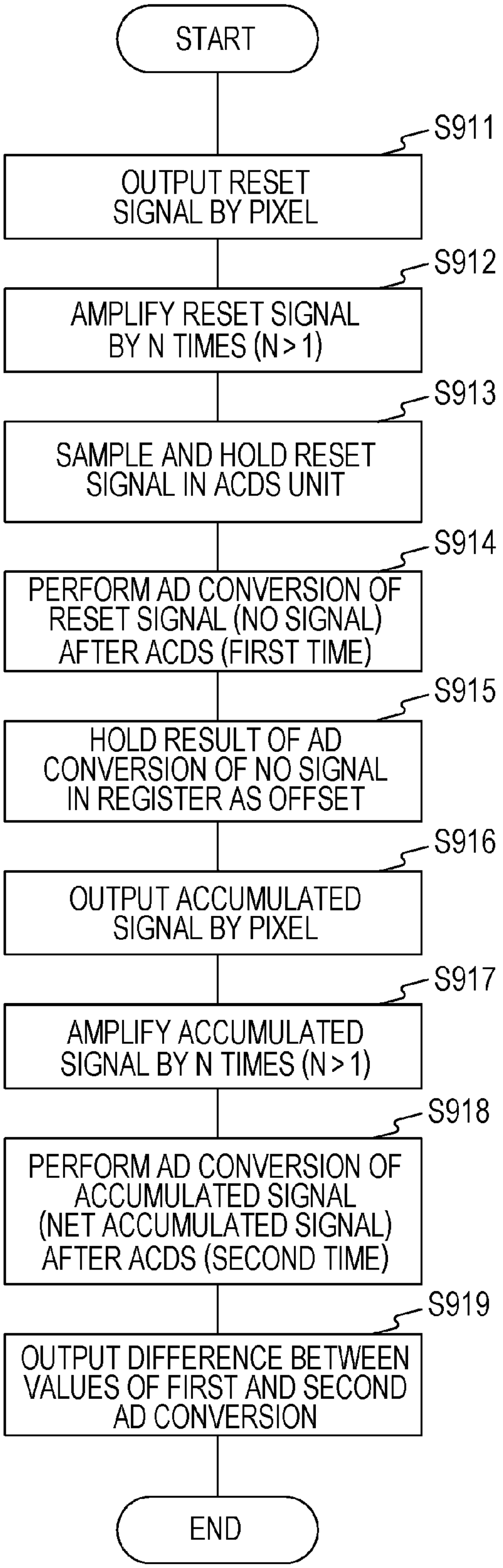
FIG. 9 is a flowchart illustrating an example of a processing procedure of when a pixel value of the pixel 310 is calculated in the imaging element 100 of the first embodiment of the present technology.

FIG. 9 is a flowchart illustrating an example of a processing procedure of when a pixel value of the pixel 310 is calculated in the imaging element 100 of the first embodiment of the present technology.

Note that, in FIG. 9, an example of a processing procedure corresponding to the function configuration of the determination circuit 400 illustrated in FIG. 4 will be illustrated.

First, in the pixel (pixel 310) in a selected row, the potential of the gate terminal of the amplifier transistor 314 (the potential of FD 322) is reset, and the reset signal is output to the vertical signal line 341 (step S911).

Next, the reset signal output from the pixel 310 is amplified by N times (N>1) by the amplifier unit 440 (step S912). Then, the reset signal amplified by the amplifier unit 440 is sampled and held by the capacitor 413 of the ACDS unit 410 (step S913). Note that step S912 is an example of an amplification procedure described in the claims.

Following that, the signal (no signal) of the difference between the reset signal amplified by the amplifier unit 440 and the sampled and held reset signal is subjected to the AD conversion by the AD conversion unit 421 of the DCDS unit 420 (step S914). Note that the no signal subjected to the AD conversion includes noises caused by the comparator 411 and the AD conversion unit 421, and the value for offsetting these noises is digitally detected. Then, a result of the AD conversion of the no signal is held in the register 422 as an offset value (step S915). Note that step S914 is an example of a calculation procedure described in the claims.

Next, in the pixel 310, the electrons accumulated in the photodiode 311 is transferred to the FD 322, and the accumulated signal is output from the pixel 310 (step S916). Following that, the accumulated signal output from the pixel 310 is amplified by N times (N>1) by the amplifier unit 440 (step S917). Then, the signal of the difference between the accumulated signal amplified by the amplifier unit 440 and the sampled and held reset signal (net accumulated signal) is subjected to the AD conversion by the AD conversion unit 421 of the DCDS unit 420 (step S918). Note that a result of the AD conversion includes noises caused by the comparator 411 and the AD conversion unit 421.

Then, the value obtained by subtracting the value of the result of the AD conversion of the no signal (first time) held in the register 422 from the value of the result of the AD conversion of the net accumulated signal (second time) is output from the subtractor 424 (step S919). Accordingly, the noises caused by the comparator 411 and the AD conversion unit 421 (offset components) are canceled, and the digital value (net digital value) of only the accumulated signal output from the pixel 310 is output.

According to the first embodiment of the present technology, the amplifier unit 440 (the amplifier circuit 460 of FIG. 5) is provided, and the accuracy of the AD conversion is set according to the amplification magnification of a signal (the potential difference of the step), whereby the speed of the AD conversion of the offset component can be improved. Note that the time required for the AD conversion of the offset component takes up more of the AD conversion time as the count of the accumulated signal (steps) is smaller. That is, a high effect can be obtained in an imaging element in which the use is focused on the low luminance imaging, and the count (steps) for the accumulated signal is set small.

2. Second Embodiment

In the first embodiment of the present technology, the description has been given assuming a case in which a pixel that can accumulate a plurality of electrons is provided in a pixel array unit, and an accumulated signal has multi values. Note that, as described in the first embodiment of the present technology, the effect of shortening of the time to perform the AD conversion to the offset of the comparator becomes higher as the time length corresponding to the AD conversion of the accumulated signal in the accumulated signal count period becomes shorter. That is, when the time length of the accumulated signal count period is set shortest in the imaging element for detecting the existence of incidence of one photon, the effect of the shortening of the time to perform the AD conversion of the offset of the comparator becomes highest.

Therefore, in the second embodiment of the present technology, an imaging element for detecting existence of incidence of one photon will be described with reference to FIG. 10.

[An Example of a Function Configuration in an Imaging Element that Detects Existence of Incidence of One Photon]

FIG. 10 is a conceptual diagram illustrating an example of a function configuration example of a determination circuit for detecting one photon (one-photon detection determination circuit 600) of a second embodiment of the present technology.

Note that the one-photon detection determination circuit 600 illustrated in FIG. 10 is provided in an imaging element instead of the determination circuit 400 of FIG. 1. Further, the one-photon detection determination circuit 600 has a similar configuration to the determination circuit 400 of FIG. 1. In FIG. 10, the configuration similar to the determination circuit 400 of FIG. 1 is described as the determination circuit 400 similarly to FIG. 1.

The one-photon detection determination circuit 600 determines existence of incidence of one photon in a pixel (pixel 310), and includes a determination circuit 400, a binary determination unit 611, an adder 612, and a memory 613.

Note that the determination circuit 400 in the one-photon detection determination circuit 600 supplies a net digital value (pixel value) generated based on an output signal supplied from the pixel 310 to the binary determination unit 611.

The binary determination unit 611 performs binary determination. The binary determination unit 611 compares the net digital value and the reference signal of the binary determination unit 611 (illustrated as "REF" in FIG. 10), binarily determines the existence of incidence of a photon to the pixel 310, and outputs a determination result (illustrated as "BINOUT" in FIG. 10). Note that, as the reference signal (REF), a value in the vicinity of the intermediate value of the digital value of the signal (no signal) output from the pixel 310 when there is no incident photon, and the signal (no signal) output from the pixel 310 when there is an incident photon is set (for example, "50" that is the middle of "0" and "100" is the reference signal).

For example, when the net digital value supplied from the determination circuit 400 exceeds the value of the reference signal (REF), the signal (BINOUT) of the value of "1" is output indicating "there is an incident photon". Meanwhile, when the net digital value supplied from the determination circuit 400 does not exceed the value of the reference signal (REF), the signal (BINOUT) of the value of "0" is output indicating "there is no incident photon". That is, the existence of an incident photon is output from the binary determination unit 611 as a digital value (0 or 1) of the binary determination result. The binary determination unit 611 supplies the determination result (BINOUT) to the adder 612.

The adder 612 adds the digital value of the determination result supplied from the binary determination unit 611 to the count value of each pixel held in the memory 613. The adder 612 acquires, from the memory 613, the count value of the pixel 310 that has generated the accumulated signal, which has been caused to be the digital value by the binary determination, and adds the digital value of the binary determination result to the acquired count value. Then, the adder 612 supplies the added count value to the memory 613, and causes the memory 613 to update the count value of the pixel.

The memory 613 digitally stores the count value that indicates the intensity of light of each pixel. The memory 613 outputs the count value in which the binary determination results are accumulated a predetermined number of times from an output circuit. Note that, in FIG. 10, for convenience of description, a signal line to the output circuit is omitted.

Note that, in FIG. 10, the description has been given assuming the example in which the binary determination unit 611 and the adder 612 are provided in each determination circuit 400. However, the embodiment is not limited to the example, and the binary determination unit 611 and the adder 612 may be shared by a plurality of determination circuits 400. Further, the binary determination unit 611 and the adder 612 may be provided in a signal processing chip that receives a signal from a semiconductor imaging chip and processes the signal, other than being provided in the semiconductor imaging chip (imaging element 100).

Next, a relationship between the number of photons incident on each pixel and a detection result will be described with reference to FIG. 11.

[An Example of a Relationship Between the Number of Photons Incident on Each Pixel and a Detection Result]

FIG. 11 is a graph illustrating a relationship between the number of photons incident on each pixel during a unit exposure period and a count probability in the second embodiment pf the present technology.

Note that description will be given assuming that the photons are uniformly and randomly incident on each pixel of the imaging element in each pixel of the imaging element. Note that it is assumed that the photons are also uniformly and randomly incident in a temporal sense.

In such conditions, a relationship between an average number of photons incident on each pixel during a unit exposure period (the average number of photons), and a probability (count probability) that the incident photon is counted (the one-photon detection determination circuit 600 determines "1") follows Poisson distribution. The relationship follows Poisson distribution, and thus the relationship between the average number of photons and the count probability satisfies the relationship described in the following formula 1:

[Mathematical Formula 1]

Here, P(k) is a probability that incidence of a photon occurs k times (k photons are incident) in a unit pixel in the exposure period. Further, λ is an average number of photons incident on the unit pixel in the unit exposure period (the average number of photons). Further, e is a base of natural logarithm (≈2.718).

That is, the probability P(k) of the formula 1 indicates a probability that the number of incident photons is the number of photons k when the number of photons incident on each pixel during the unit exposure period is the average number of photons λ.

Here, the relationship between the average number of photons and the count probability will be described assuming that an average of the number of photons incident on each pixel of the imaging element during the unit exposure period (the average number of photons λ) is "0.21". In this case, the number of photons k and the probability P(k) satisfies the following relationship based on the formula 1.

The probability that the photons incident on the unit pixel is 0 (k=0): 0.8105

The probability that the photons incident on the unit pixel is 1 (k=1): 0.1702

The probability that the photons incident on the unit pixel is 2 (k=2): 0.0179

The probability that the photons incident on the unit pixel is 3 (k=3): 0.0013

. . . (hereinafter, values are very small (0.00007 or less) and thus omitted).

As described above, the value of the probability that the photons incident on the unit pixel overlap with each other becomes smaller as the number of overlapping photons is increased.

Next, a signal generated by the imaging element when the photons are incident with the probability will be described.

The digital value output by the one-photon detection determination circuit 600 being "0" corresponds to the case in which the photons incident on the pixel is 0. That is, the probability that the digital value becomes "0" is "0.8105" that is the probability of the case in which the photons incident on the unit pixel is 0.

Meanwhile, the digital value output by the one-photon detection determination circuit 600 being "1" corresponds to all of the cases in which the photons incident on the unit pixels is 1 or more. That is, the probability that the digital value becomes "1" is "0.1894" that is a total value of the probabilities of the cases in which the photons incident on the unit pixel is 1 or more.

Note that the average number of photons λ is "0.21", the count probability "0.1894" indicates that about 10% of the incident photons are not counted (count loss). This count loss is caused because two or more photon incidences in the unit pixel are counted "1" during the unit exposure period. Therefore, the count loss becomes larger as the average number of photons λ becomes larger.

The description has been given assuming that the average number of photons λ is "0.21". However, the relationship between the average number of photons λ and the count probability is unique when the photons are uniformly and randomly incident in spatial and temporal senses. That is, the relationship between the count probability and the average number of photons is the relationship illustrated by the solid line (line 511) in the graph of the FIG. 11 where the vertical axis represents the count probability and the horizontal axis represents the average number of photons incident on each pixel during the unit exposure period.

Note that, in the graph of FIG. 11, the position of the average number of photons illustrated by the chain line (chain line 512) indicates a position where about 10% of the incident photons are subjected to the count loss (10% detection loss position). When the about 10% count loss is permitted, the linearity can be guaranteed when the average number of photons is "0.21" or less. From the viewpoint of the digital output value generated by the imaging element, that is, when the count probability in the digital value generated by the imaging element is "0.1894" or less, it is determined that the imaging has been done in the conditions of illumination and exposure that can guarantee the linearity. Meanwhile, when the count probability exceeds "0.1894" (the range illustrated by the compression region 513 in FIG. 6), it is determined that there are many count losses and the linearity cannot be guaranteed.

Note that there is the relationship as illustrated in the graph of FIG. 11 between the count probability and the average number of photons. Therefore, by holding the data indicating the relationship illustrated in the graph (for example, Poisson distribution, a function or a table approximated to Poisson distribution), correction can be applied to the count value. This correction first calculates the count probability (the ratio of the pixel having the value "1" to all of the pixels) based on the digital value generated by the imaging element, and calculates the average number of photons from the count probability and the data indicating the relationship illustrated in the table of FIG. 11. Then, the number of photons incident on the imaging element from the calculated average number of photons. When this correction is performed, the detection dynamic range can be increased by about one digit, compared with a case in which the imaging element is used within a range that can guarantee the linearity (in a case of no correction).

As described above, according to the second embodiment of the present technology, by providing the amplifier unit 440 (the amplifier circuit 460 of FIG. 5), the speed of the AD conversion is improved, and the one photon determination can be performed. Especially, when counts (steps) for the accumulated signal become smallest, the ratio of the AD conversion time of the offset component to the time required for the AD conversion becomes highest, and thus the maximum effect by providing of the amplifier circuit can be obtained.

3. Third Embodiment

In the first and second embodiments of the present technology, the description has been given assuming that pixels having a configuration as illustrated in FIG. 2 are arranged in a pixel array unit. However, the present technology is not limited these embodiments, and can be similarly implemented even in a case where pixels having another configuration are arranged in the pixel array unit.

Therefore, in the third embodiment of the present technology, an example of an imaging element in which a pixel that modulates a potential of an amplifier transistor on a substrate side by accumulated charges of the pixel, and obtains an output signal is arranged will be described with reference to FIGS. 12 and 13.

Note that the imaging element of the third embodiment of the present technology is similar to those in the first and second embodiments of the present technology, except that a pixel (pixel 710) that modulates a potential of an amplifier transistor on the substrate side, and obtains an output signal is included in the imaging element in place of the pixel 310. Further, in the pixel 710, the order of outputting signals (a reset signal and an accumulated signal) is different from the pixel 310, and thus an operation order in a determination circuit (determination circuit 400) is different. Therefore, a configuration of the pixel 710 will be described with reference to FIG. 12, and then, a timing chart will be described with reference to FIG. 13.

[An Example of a Circuit Configuration of a Pixel]

Figure 12:
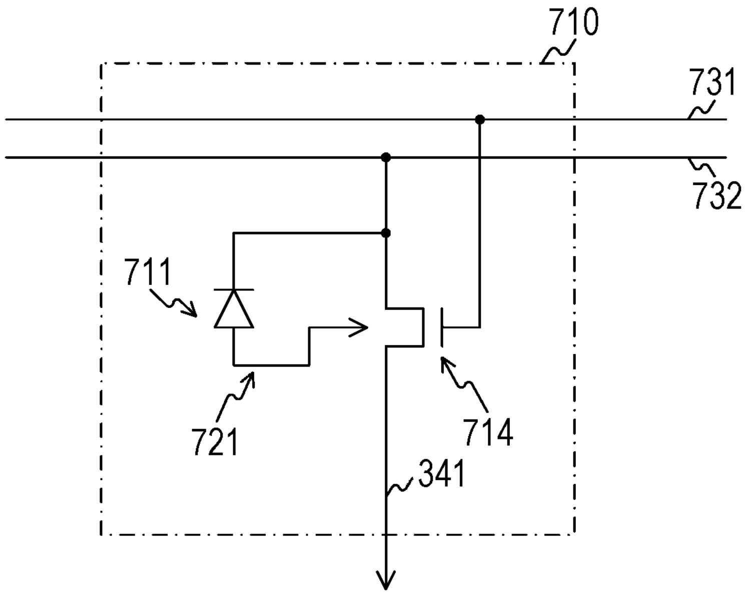
FIG. 12 is a schematic diagram illustrating an example of a circuit configuration of a pixel (pixel 710) of a third embodiment of the present technology.

FIG. 12 is a schematic diagram illustrating an example of a circuit configuration of a pixel (pixel 710) of a third embodiment of the present technology.

The pixel 710 is a pixel that modulates a potential of an amplifier transistor on the substrate side by accumulated charges of the pixel and obtains an output signal. The pixel 710 includes a photodiode 711 and an amplifier transistor 714.

Note that the pixel 710 is a conventionally disclosed pixel (for example, see JP 11-195778 A), and thus will be simply described.

The photodiode 711 is provided adjacent to the amplifier transistor 714, and a well region of the photodiode 711 on an anode terminal side (displayed as node 721 in FIG. 12) is provided to modulate a substrate bias of the amplifier transistor 714. Further, a drain terminal of the amplifier transistor 714 and a signal line (signal line 732) for supplying a drain voltage are connected to a cathode terminal of the photodiode 711. Further, a signal line (signal line 731) for supplying a scanning signal is connected to a gate terminal of the amplifier transistor 714, and a vertical signal line 341 is connected to a source terminal of the amplifier transistor 714.

In this pixel 710, a charge generated by photoelectric conversion of the photodiode 711 (here, a hole) is accumulated in the well region of the photodiode 711 on the anode terminal side (illustrated as the node 721 in FIG. 12). The accumulated charge (hole) modulates the substrate bias of the amplifier transistor 714, and thus a signal of the pixel 710 output to the vertical signal line 341 is modulated.

In such a pixel 710, the accumulated charge is always stayed in a potential portion deep in the bulk, and is less easily captured in a charge trap in a substrate surface. Therefore, it can be considered that the pixel 710 is suitable for treating minute charges. Further, by fully depleting the well region (node 721) of the photodiode 711 on the anode terminal side, causing the well region to be in a reset state, occurrence of a kTC noise can be prevented.

Note that, when a signal is read form the pixel 710, first, a signal in an accumulation state is read. Next, the pixel 710 is driven through the signal line 731 and the signal line 732 and the charge of the node 721 is discharged to the substrate side, and the pixel 710 is caused to be in the reset state. Then, the pixel 710 reads the signal in the reset state. Following that, by taking a difference between the signal in the accumulated state and the signal in the reset state, a signal (net digital value) in which offset components due to variation of a threshold value of the amplifier transistor 714 and the like have been offset is generated.

As described above, the order of reading the signal of the pixel 710 is reverse to the order of reading signal of the pixel (pixel 310) of the first and second embodiments of the present technology. That is, the operation order in the determination circuit (determination circuit 400) is reverse.

[An Operation Example of an Imaging Element]

Next, an operation of the imaging element in the third embodiment of the present technology will be described with reference to the drawing.

Figure 13:
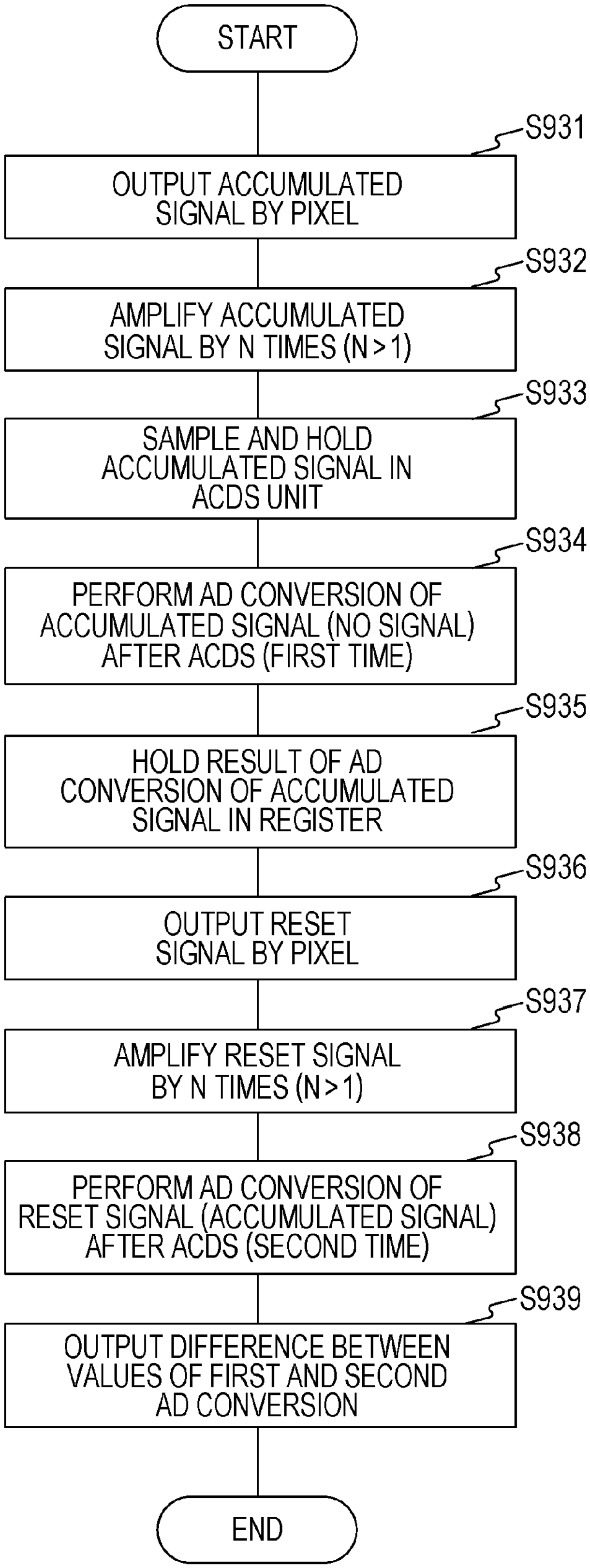
FIG. 13 is a flowchart illustrating an example of a processing procedure of when a pixel value of the pixel 710 is calculated in an imaging element of the third embodiment of the present technology.

FIG. 13 is a flowchart illustrating an example of a processing procedure of when a pixel value of the pixel 710 is calculated in the imaging element of the third embodiment of the present technology.

Note that the flowchart illustrated in FIG. 13 is a modification of the flowchart illustrated in FIG. 9, and is different in that the order of reading a signal is reverse, and the signal held by sampling and holding by the ACDS is reverse.

In steps S931 to S935 in the flowchart of FIG. 13, processing is performed using the accumulated signal instead of the reset signal used in the steps S911 to S915 of FIG. 9. Further, in step S936 to S938 in the flowchart of FIG. 13, the processing is performed using the reset signal instead of the accumulated signal used in steps S916 to S918 of FIG. 9. Note that step S939 of FIG. 13 corresponds to step S919 of FIG. 9.

That is, first, the accumulated signal is output from the pixel (pixel 710) in the selected row to the vertical signal line 341 (step S931), and then the accumulated signal is amplified by N times by the amplifier unit 440 (step S932). Then, the accumulated signal amplified by the amplifier unit 440 is sampled and held by the capacitor 413 of the ACDS unit 410 (step S933).

Following that, a signal (no signal) of a difference between the accumulated signal amplified by the amplifier unit 440 and the sampled and held accumulated signal is subjected to the AD conversion by the AD conversion unit 421 of the DCDS unit 420 (step S934). Then, a result of the AD conversion of the no signal is held in the register 422 as an offset value (step S935).

Following that, in the pixel 710, the well region (node 721) of the photodiode 711 on the anode terminal side is caused to be in the reset state, and a reset signal is output from the pixel 710 (step S936). Following that, the accumulated signal output from the pixel 710 is amplified by N times (N>1) by the amplifier unit 440 (step S937). Then, a signal (net accumulated signal) of a difference between the reset signal amplified by the amplifier unit 440 and the sampled and held accumulated signal is subjected to the AD conversion by the AD conversion unit 421 of the DCDS unit 420 (step S938).

Then, a value obtained by subtracting a value of the result of the AD conversion of the no signal (first time) held in the register 422 from a value of the result of the AD conversion of the net accumulated signal (second time) is output by the subtractor 424 (step S939). As described above, even when the accumulated signal is output earlier than the reset signal, noises (offset components) caused by the comparator 411 and the AD conversion unit 421 are canceled, and a digital value (net digital value) of only the accumulated signal output by the pixel 710 can be generated.

As described above, according to the third embodiment of the present technology, even when a pixel that outputs the reset signal after outputting the accumulated signal is provided, the speed of the AD conversion of the offset component can be improved.

4. Fourth Embodiment

In the first embodiment of the present technology, an example of sampling the reset signal and the accumulated signal once has been described. Here, if the number of times of sampling is increased, a signal/noise (S/N) ratio is improved.

Therefore, in the fourth embodiment of the present technology, an example of acquiring a determination result having a high S/N ratio by performing a plurality of times of sampling will be described with reference to FIG. 14.

[An Example of a Timing Chart]

Figure 14:
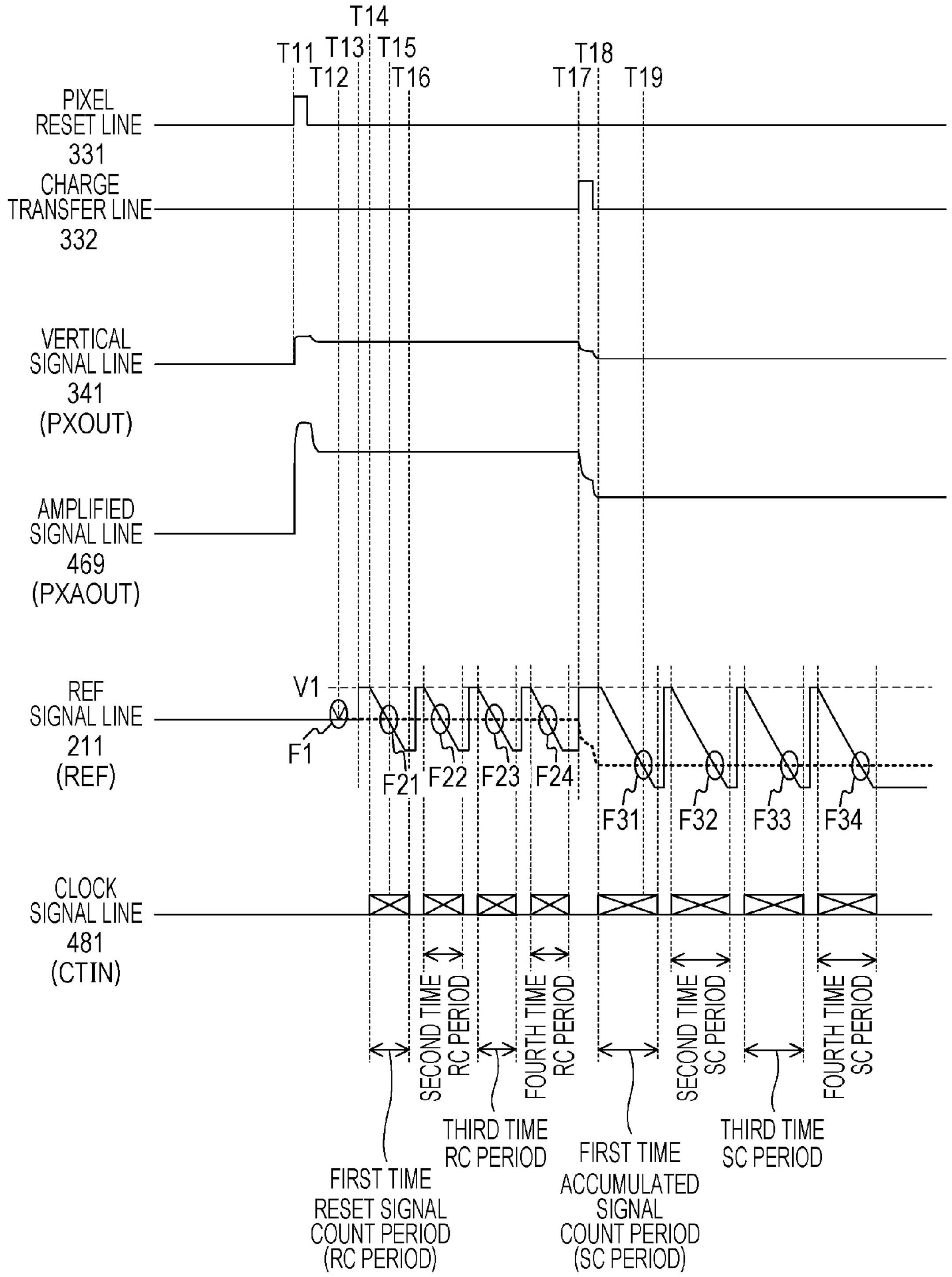
FIG. 14 is a timing chart illustrating an example of when a determination circuit 400 performs a plurality of times of sampling in a fourth embodiment of the present technology.

FIG. 14 is a timing chart illustrating an example of when a determination circuit 400 performs a plurality of times of sampling in a fourth embodiment of the present technology.

Note that the timing chart illustrated in FIG. 14 is a modification of the timing chart illustrated in FIG. 6, and is different in that the number of times of sampling is different. Therefore, in FIG. 14, description will be given focusing on a plurality of times of sampling. Note that, in FIG. 14, an example of performing sampling four times will be described as an example.

Timings T11 to T18 illustrated in FIG. 14 correspond to the timings T1 to T8 of FIG. 6. Note that the timings T13 to T16 corresponding to the timings T3 to T6 of FIG. 6 illustrate timings in a first reset signal count period of a plurality of times of reset signal count periods. Further, the timings T18 and T19 corresponding to the timings T8 and T9 of FIG. 6 illustrate timings in a first accumulated signal count period of a plurality of times of accumulated signal count periods.

Note that, regarding the potential of the REF signal line 211 illustrated in FIG. 14, a ramp wave is illustrated by the slant line, due to space constraints. Further, as for the potential of the clock signal line 481 illustrated in FIG. 14, a supply period of pulses is schematically illustrated by the rectangles with two cross slant lines.

The frames F21 to F24 correspond to the frame F2 of FIG. 6, and illustrate stop timings of count in the first to fourth reset signal count periods. In the example of FIG. 14, the ramp waves for counting the reset signal is supplied four times during sampling and holding of the reset signal is performed, and the reset signals are counted four times, as illustrated by the frames F21 to F24. Note that the counter 480 performs count (counter addition) such that the count values of the four times are added. That is, while count is started from an initial value in the first time, count is performed from a following value of the last time count value in the second to fourth times.

The frames F31 to F34 correspond to the frame F3 of FIG. 6, and illustrate stop timing of count in the first to fourth accumulated signal count periods. As illustrated in FIG. 14, the ramp wave for counting the accumulated signal is supplied four times while the potential of the amplification signal line 469 is a potential according to the accumulated signal, and the accumulated signal is counted four times, as illustrated by the frames F31 to F34. Note that, similarly to the count of the reset signal, the counter 480 performs count such that the count values of the four times are added.

Here, improvement of the S/N ratio by the plurality of times of sampling will be described. For example, when the sampling is conducted K times, an added value of the accumulated signal becomes K times. Meanwhile, an added value of the reset signal is suppressed to A/K at minimum because of counting random noises. That is, the S/N ratio is improved to A/K times at maximum. In FIG. 14, the sampling is performed four times, and thus the added value of the accumulated signal becomes four times, while the added value of the reset signal is suppressed to twice when the random noise is independently caused in the individual sampling period.

Note that, as illustrated in FIGS. 8*a* and 8*b*, the time required for the AD conversion of the reset signal is reduced by the amplification of the amplifier unit 440 (×1/N times). Therefore, the plurality of times of sampling in the same detection time can be performed, compared with a conventional method that does not include the amplifier unit 440. Further, the time from the start of the AD conversion of the reset signal (timing T13) to the start of the AD conversion of the accumulated signal (timing T18) is shortened by about 1/N, and thus the offset effect of a high-frequency component of the random noise by the digital CDS can be enhanced. That is, by combining the amplification by the amplifier circuit, a plurality of times of sampling, and the digital CDS, the effect of a decrease in the random noise can be further enhanced.

As described above, according to the fourth embodiment of the present technology, influence of the ransom noise is reduced by the plurality of times of sampling, and the speed of the AD conversion of the offset component can be improved.

5. Fifth Embodiment

In the first to fourth embodiments of the present technology, examples have been described, in which an amplifier unit that generates a positive phase output to an input is provided in each column. Note that, in the embodiments of the present technology, a signal output from a pixel may just be amplified before being supplied to a comparator, and thus, regarding a method of amplifying the signal, various other examples can be considered.

Figure 15:
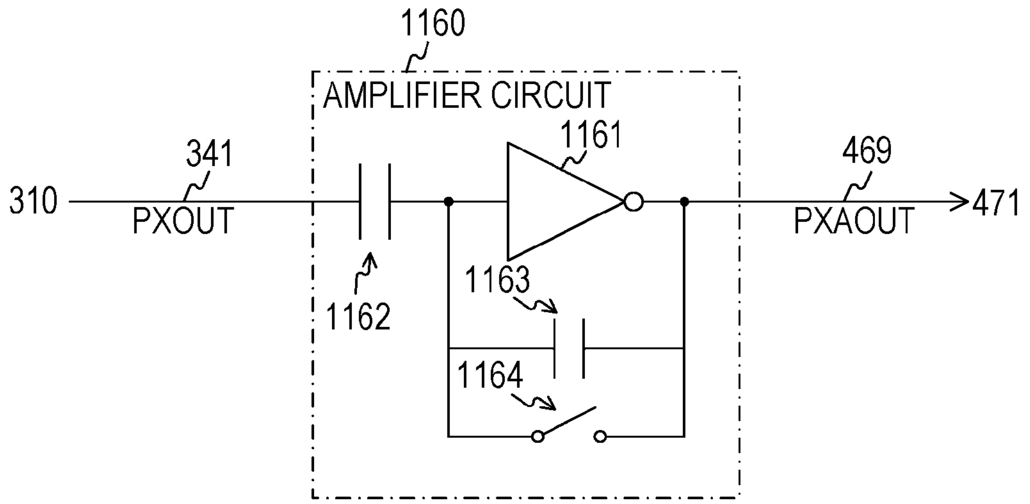
FIG. 15 is a diagram schematically illustrating an example of a circuit configuration example of an amplifier circuit (amplifier circuit 1160) in an example of performing amplification using an amplifier circuit an inverter of a fifth embodiment of the present technology.
Figure 16:
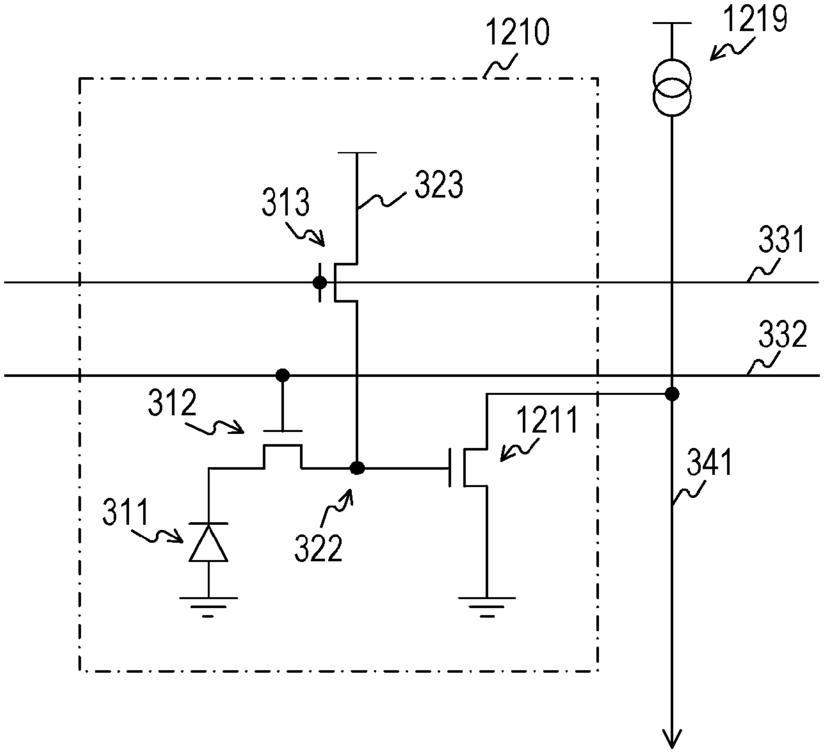
FIG. 16 is a schematic diagram illustrating an example of a circuit configuration of a pixel (pixel 1210) in an example of providing a source ground type NMOS transistor of the fifth embodiment of the present technology in a pixel as an amplifier transistor and amplifying an output from the pixel.
Figure 17:
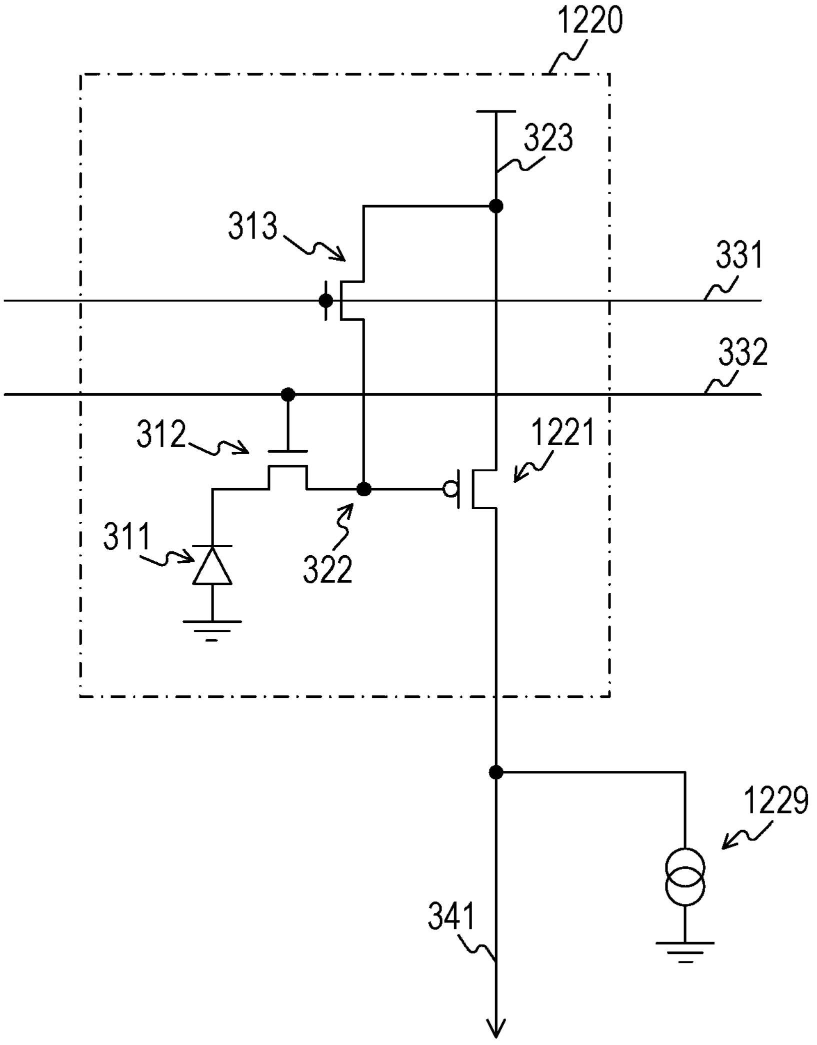
FIG. 17 is a schematic diagram illustrating an example of a circuit configuration of a pixel (pixel 1220) in an example of providing a source ground type PMOS transistor of the fifth embodiment of the present technology in a pixel as an amplifier transistor, and amplifying an output from the pixel.
Figure 18:
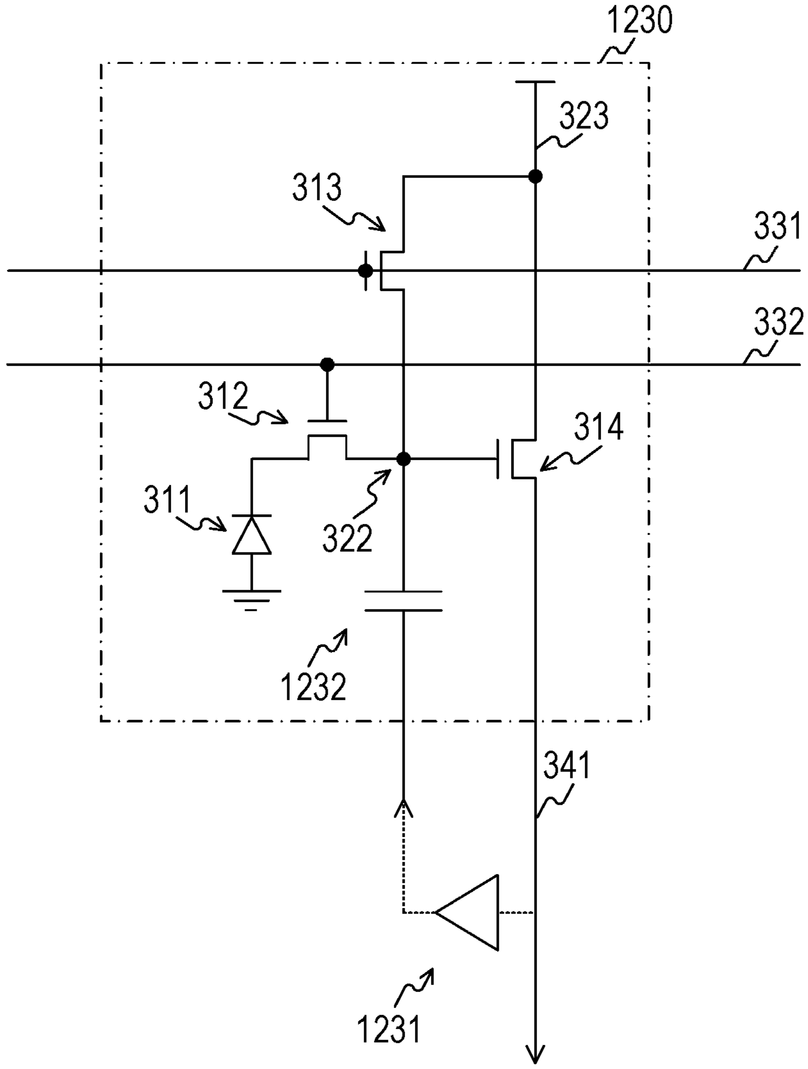
FIG. 18 is a schematic diagram illustrating an example of a circuit configuration of a pixel (pixel 1230) in an example of feeding back an output from the pixel of the fifth embodiment of the present technology to a floating diffusion.
Figure 19:
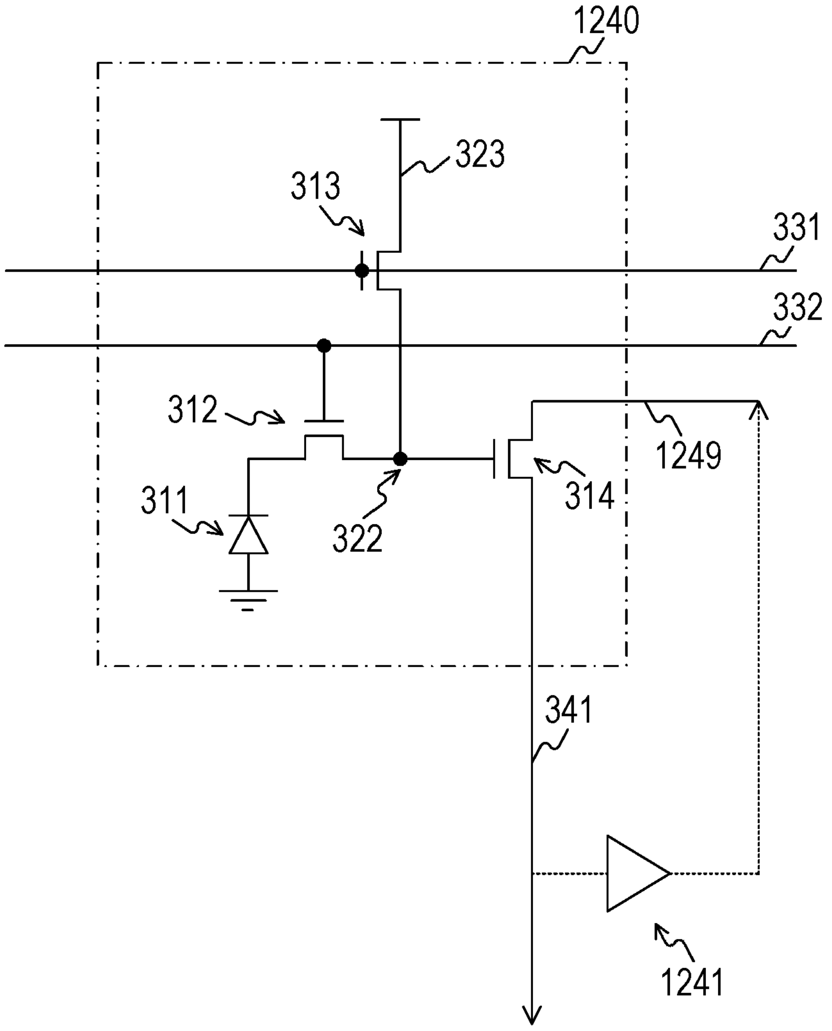
FIG. 19 is a schematic diagram illustrating an example of a circuit configuration of a pixel (pixel 1240) in an example of feeding back an output from the pixel of the fifth embodiment of the present technology to a drain terminal of an amplifier transistor.

Therefore, in the fifth embodiment of the present technology, a plurality of amplifying method will be described. Note that FIG. 15 illustrates an example in which an amplifier circuit is provided instead of the amplifier circuit 460, and FIGS. 16 and 17 illustrate examples in which an amplifier circuit is not provided and an amplifier transistor of a pixel is a source ground type amplifier transistor, and amplification is performed in the pixel. Further, FIGS. 18 and 19 illustrate examples in which an amplifier circuit 460 is not provided, an output of a pixel is fed back to floating diffusion of the pixel, and amplification is performed in the pixel.

[An Example of Performing Amplification Using an Amplifier Circuit of an Inverter]

FIG. 15 is a diagram schematically illustrating an example of a circuit configuration example of an amplifier circuit (amplifier circuit 1160) in an example of performing amplification using an amplifier circuit an inverter of a fifth embodiment of the present technology.

An amplifier circuit 1160 includes an inverter 1161, capacitors 1162 and 1163, and a switch 1164.

An input terminal of the inverter 1161 is connected to one electrode of the capacitor 1162, one electrode of the capacitor 1163, and one end of the switch 1164. Further, an output terminal of the inverter 1161 is connected to the other electrode of the capacitor 1163 and the other end of the switch 1164, and to one electrode of the capacitor 471 through an amplification signal line 469. Further, the other electrode of the capacitor 1162 is connected to a pixel 310 through a vertical signal line 341.

The amplifier circuit 1160 amplifies an input signal (PXOUT) using a CMOS inverter (inverter 1161), and performs signal amplification according to the ratio of the two capacities (the capacitors 1162 and 1163). Note that the amplifier circuit 1160 is an amplifier using an inverter, and thus the output signal (PXAOUT) is a reverse phase of the input signal (PXOUT).

Further, compared with the amplifier circuit 460 illustrated in FIG. 5, the amplifier circuit 1160 has large a 1/f noise generated as a random noise, and a noise to generate is large. Therefore, as a transistor that configures the inverter 1161, it is desirable to provide a transistor having a sufficiently larger area than the amplifier transistor (the amplifier transistor 314 of FIG. 2) provided in individual pixel. For example, when a determination circuit including the amplifier circuit 1160 is provided in the imaging element, if the determination circuit is shared by a plurality of columns, an area allocated to an individual amplifier circuit 1160 can be made larger.

As illustrated in FIG. 15, the output of the pixel can be amplified by an amplifier (amplifier circuit 1160) using an inverter.

[An Example of Providing a Source Ground Type Amplifier Transistor in a Pixel and Amplifying an Output from the Pixel]

FIG. 16 is a schematic diagram illustrating an example of a circuit configuration of a pixel (pixel 1210) in an example of providing a source ground type NMOS transistor of the fifth embodiment of the present technology in a pixel as an amplifier transistor and amplifying an output from the pixel.

A pixel 1210 includes a source ground type amplifier transistor 1211 in place of the source follower type amplifier transistor 314 included in the pixel 310 of FIG. 2. Note that the configuration of the pixel other than the amplifier transistor 1211 is similar to that of FIG. 2, and thus the same reference signs as FIG. 2 are denoted and description here is omitted.

The amplifier transistor 1211 is an amplifier transistor configured from a source ground type NMOS transistor, a source terminal side of which is grounded. A drain terminal of the amplifier transistor 1211 is connected to a constant current source 1219, and to a determination circuit through the vertical signal line 341. The amplifier transistor 1211 is a source ground type amplifier transistor, and thus amplifies an input (a potential of an FD 322), and can output the input to the vertical signal line 341.

Here, an amplification gain of the amplifier transistor 1211 will be described. An operation of the amplifier transistor 1211 satisfies a relationship of the following formula 2, for example.

$$\Delta I_d = g_m \cdot \Delta V_g + \Delta V_d / R_d \quad \text{Formula 2}$$

Here, $\Delta I_d$ is a change amount of drain current from a drain current before amplification. $g_m$ is a transconductance. $\Delta V_g$ is a change amount of gate voltage from a gate voltage before amplification, $R_d$ is a drain resistance, and $\Delta V_d$ is a change amount of drain voltage from a drain voltage before amplification.

In the relationship of the formula 2, the drain terminal of the amplifier transistor 1211 is connected to a current source load ($\Delta I_d = 0$), an amplification gain ($A_v$) of the amplifier transistor 1211 satisfies a relationship of the following formula 3.

$$A_v = \Delta V_d / \Delta V_g = -g_m \cdot R_d \quad \text{Formula 3}$$

As can be seen from the minus sign in the formula 3, an output of the amplifier transistor 1211 is a reverse phase. Further, the magnification of the amplification is typically larger than 1 (much larger), and thus the output signal of the pixel is amplified by the amplifier transistor 1211. In the fifth embodiment of the present technology, the signal is amplified when the signal is output from the amplifier transistor 1211, and thus it is not necessary to provide an amplifier in the determination circuit. That is, when the pixel 1210 is provided in the imaging element, the amplifier circuit 460 of the determination circuit 400 illustrated in FIG. 5 is omitted, and the output of the pixel 1210 amplified by the amplifier transistor 1211 is directly supplied to the capacitor 471.

Note that the transconductance $g_m$ and the drain resistance r are values slightly varied in accordance with a change of an operating point. Therefore, an output from the amplifier transistor 1211 is poor in linearity. However, when binary determination is performed in the one-photon detection, only a small amount of electrons are accumulated, and thus the variation of the potential of the FD 322 is small, and the operating point becomes substantially constant. Further, in the case of one photon detection, only existence of a signal (0 or 1) is determined, and thus the deterioration of the linearity is not a problem. That is, this example of providing a source ground type amplifier transistor in a pixel is especially suitable for one photon detection. Further, in this example, an increase in the random noise associated with addition of unnecessary transistors and circuits (for example, the addition of the amplifier circuit 460 of the determination circuit 400 illustrated in FIG. 5) does not occur.

Note that, in FIG. 16, an example in which the constant current source 1219 and the power source of the pixel (the power source supplied to the pixel through the power line 323 (power source voltage)) are separated has been described. In FIG. 16, it is assumed that a PMOS transistor is used in a saturated region as the constant current source 1219. In this case, by making the potential of the power source of the constant current source 1219 larger than the potential of the power source of the pixel, which is supplied to the pixel through the power line 323, an operating point suitable for the amplification can be secured.

Note that, in FIG. 16, an example in which the source ground type amplifier transistor 1211 is configured from a typical NMOS transistor has been described. However, the source ground type amplifier transistor can be provided in the pixel using a PMOS transistor. In this case, it is not necessary to set the potential of the power source of the constant current source higher than the potential of the power source of the pixel, and thus setting of the potential of the power source of the constant current source can be easily performed. Next, an example in which the source ground type amplifier transistor 1211 is configured from a PMOS transistor will be described with reference to FIG. 17.

FIG. 17 is a schematic diagram illustrating an example of a circuit configuration of a pixel (pixel 1220) in an example of providing a source ground type PMOS transistor of the fifth embodiment of the present technology in a pixel as an amplifier transistor, and amplifying an output from the pixel.

The pixel 1220 includes an amplifier transistor 1221 configured from a source ground type PMOS transistor in place of the amplifier transistor 314 configured from a source ground type NMOS transistor of FIG. 16. Note that the configuration of the pixel other than the amplifier transistor 1221 is similar to that in FIGS. 2 and 16, and thus the same reference signs are denoted and description here is omitted.

The amplifier transistor 1221 is an amplifier transistor configured from a source ground type PMOS transistor. A gate terminal of the amplifier transistor 1221 is connected to the FD 322, and a source terminal is connected to the power line 323, and a drain terminal of the reset transistor 313. Further, a drain terminal of the amplifier transistor 1221 is connected to a constant current source 1229, and to the determination circuit through the vertical signal line 341. The amplifier transistor 1221 generates a positive phase output, similarly to the amplifier transistor 314 of FIG. 2.

As described above, when the source ground type PMOS transistor is provided as an amplifier transistor of the pixel, a typical NMOS transistor can be used in a CMOS image sensor as a constant current load (a load of the constant current source 1229). Further, compared with the pixel 1210 illustrated in FIG. 16, an operating point can be secured even if the potential of the power source of the constant current source is not made higher than the potential of the power source of the pixel, and thus setting of the operating point can be easily performed.

Note that, in FIGS. 16 and 17, the description has been given assuming that the transistor is used as the load of the constant current source. However, a resistance element can be used if output impedance can be ignored. Further, in this case, the amplification gain in the source ground type amplifier transistor can be sufficiently made larger than 1.

In FIGS. 16 and 17, an example in which the configuration of the pixel is changed, and the amplification is performed has been described. However, an example of feeding back an output of the pixel to the pixel and performing amplification can be considered. Next, an example of feeding back an output of a pixel and performing amplification will be described with reference to FIGS. 18 and 19 assuming two feeding back methods.

[An Example of Feeding Back an Output and Performing Amplification]

FIG. 18 is a schematic diagram illustrating an example of a circuit configuration of a pixel (pixel 1230) in an example of feeding back an output from the pixel of the fifth embodiment of the present technology to a floating diffusion.

The pixel 1230 includes a capacity (capacitance 1232), one end of which is connected to the FD 322, in addition to the configurations of the pixel 310 of FIG. 2. Note that the amplifier transistor 314 is a source follower type amplifier transistor, similar to that of FIG. 2, the pixel 1230 and a feedback circuit (feedback amplifier 1231) are provided for each column (each vertical signal line 341).

The feedback amplifier 1231 is a feedback circuit that feeds back an output signal of a pixel supplied to the vertical signal line 341 to the FD 322 of the pixel that has output the output signal. The feedback amplifier 1231 is realized by a PMOS transistor source follower, for example. Note that, in FIG. 18, illustration of configurations that configure the feedback amplifier 1231 (the PMOS transistor and a constant current source (constant current load transistor)) is omitted, and the feedback amplifier 1231 is illustrated by a triangle mark that indicates an amplifier. Further, in FIG. 18, the feedback amplifier 1231 provided in each column instead of being provided in each pixel is distinguished from the configuration of the pixel, illustrating input-side and output-side signal lines of the feedback amplifier 1231 by the broken lines.

An input terminal of the feedback amplifier 1231 (a gate terminal of the PMOS transistor) is connected to the vertical signal line 341. An output terminal of the feedback amplifier 1231 (a source terminal of the PMOS transistor) is connected to one end of the capacitor 1232 provided in each pixel connected to the vertical signal line 341. That is, the feedback amplifier 1231 varies the potential of the one end of the capacitor 1232 of the pixel that has output the output signal, according to the output signal supplied to the vertical signal line 341. Note that the feedback amplifier 1231 is configured from a PMOS transistor, and the relationship between the input and output is a positive phase, and thus positive feedback is applied to the potential of the FD 322.

The capacitor 1232 is a capacity for coupling the output of the feedback amplifier 1231 and the FD 322 of the pixel. That is, the potential of the FD 322 is varied according to the output of the feedback amplifier 1231 by capacitive coupling of the capacitor 1232.

Note that, although not specially illustrated in FIG. 18, when a plurality of pixels is connected to the vertical signal line 341, the potentials of the FD 322 of pixels other than the pixel that has output the output signal are also varied. Therefore, to prevent the variation of the potentials, a transistor that serves as a switch is provided between the capacitor 1232 and the feedback amplifier 1231 in each pixel (not illustrated). Then, only the transistor of the pixel that has output the output signal is caused to be in a conductive state, and the transistors of other pixels are caused to be in a non-conductive state. Accordingly, the feedback is applied only to the FD 322 of the pixel that has output the output signal.

As described above, by feeding back the output of the pixel to the FD 322, the output of the pixel can be amplified.

FIG. 19 is a schematic diagram illustrating an example of a circuit configuration of a pixel (pixel 1240) in an example of feeding back an output from the pixel of the fifth embodiment of the present technology to a drain terminal of an amplifier transistor.

In the pixel 1240, a drain terminal of the amplifier transistor 314 of the pixel 310 of FIG. 2 is connected to a line (signal line 1249) for supplying a drain terminal potential of the amplifier transistor 314 instead of being connected to a power line 323. The configuration other than the above is similar to that of the pixel 310 of FIG. 2, and thus description here is omitted. The pixel 1240 and a feedback circuit (feedback amplifier 1241) are provided for each column (each vertical signal line 341). Note that the feedback amplifier 1241 is similar to the feedback amplifier 1231 illustrated in FIG. 18, other than an output being output to the signal line 1249. Therefore, here, only influence of the output on the potential of the signal line 1249 will be described.

As illustrated in FIG. 19, in the pixel 1240, the output of the feedback amplifier 1231 is directly connected to the drain of the amplifier transistor 314, and the output of the feedback amplifier 1231 substitutes for the conventional power source connection. Accordingly, in the pixel 1240, the potential of the drain terminal of the amplifier transistor 314 is varied according to the output of the feedback amplifier 1231. Note that a drain diffusion layer of the amplifier transistor 314 has a strong parasitic capacitance with a gate electrode (floating diffusion). Therefore, when the potential at the drain side is varied, the potential of the gate of the amplifier transistor 314 (the potential of the FD 322) is varied by the parasitic capacitance between the gate and drain. That is, a decrease of the potential of the signal line 1249 due to the output of the feedback amplifier 1241 becomes positive feedback to the FD 322 through the parasitic capacitance, and the output signal of the pixel is amplified.

As illustrated in FIGS. 15 to 19, the output of the pixel can be amplified by various methods. That is, by performing the AD conversion using the amplified output as described in the first embodiment of the present technology, the speed of the AD conversion of the offset component can be improved.

As described above, according to the embodiments of the present technology, the speed of the AD conversion can be improved. That is, according to the embodiments of the present technology, a minute signal from the pixel (including a one-photon signal) can be detected with a low noise and high accuracy, and by raising the frame rate by using the signal, various high-performance imaging becomes possible.

Note that the imaging element illustrated in the embodiments of the present technology can be widely applied as a light detection unit in the conventional electronic devices, in which a photomultiplier tube, an avalanche photodiode, or a photodiode is provided. For example, the imaging element can be applied to a fluorescent scanner of an imaging plate, or a scintillation counter of radiation. Other than the above, the imaging element can be applied to a detector of a DNA chip, an X-ray imaging device called digital radiography (DR), a computed tomography (CT) device, a single phone emission tomography (SPECT) device, or the like. Especially, the imaging element is a CMOS image sensor and thus can be mass-produced at a low price. Therefore, by providing a large number of light detection units in an electronic device that can only include a small number of light detection units due to a high price of the photomultiplier tube.

For example, if the imaging element illustrated in the embodiments of the present technology is introduced into a detector of a CT device, more highly sensitive scintillation light can be detected, compared with the detector by a conventional photodiode, and thus the imaging element can contribute to highly accurate detection and a low exposure dose due to a decrease in an X-ray dose. Note that the same applies to gamma-ray detection that conventionally used to use a photomultiplier tube, such as SPECT or PET.

Note that not only an electronic device in which a large number of detection heads are provided has the effect, but also an electronic device using a single detection head can have similar effect. For example, if the present technology is applied to a radiation scintillation dosimeter, an ultra-high sensitive pocket dosimeter can be realized using a cheap semiconductor imaging element.

Note that the above-described embodiments are examples for realizing the present technology, and the matters in the embodiments and the matters used to specify the invention have correspondence. Similarly, the matters used to specify the invention in the claims and the matters in the embodiments of the present technology, to which the same names are provided, have correspondence. Note that the present technology is not limited to the embodiments, and can be realized by applying various modifications to the embodiments without departing from the gist of the present technology.

Note that the present technology may employ the following configuration.

(1) An imaging element including: an amplifier configured to amplify signals of a pixel at a magnification larger than 1, the pixel outputting one of the signals as a reset signal, the signal being in a state in which there is no accumulation of a charge by a photon, and outputting the other of the signals as an accumulation signal, the signal being in a state in which there is accumulation of a charge by the photon; and a calculation unit configured to generate an offset amount signal corresponding to an amount of own offset component using the amplified signal, and to calculate a digital value corresponding to the own offset component using the generated offset amount signal and accuracy set for AD conversion of the amplified accumulated signal.

(2) The imaging element according to (1), wherein the calculation unit includes a holding unit configured to hold a charge in the amplified signal, a comparison unit configured to cause a signal that has offset the held charge and the amplified signal to input and to use the signal as the offset amount signal, to compare a potential of a reference signal of a ramp wave in which a potential difference of a step corresponds to the accuracy, and a potential of the offset amount signal, and to generate an offset amount signal comparison result indicating which potential is higher, and a count unit configured to count a pulse corresponding to the step of the ramp wave from a start of the comparison to when the offset amount signal comparison result is inverted, and to calculate the digital value corresponding to an offset component of the comparison unit.

(3) The imaging element according to (2), wherein the holding unit holds a charge in a signal of the amplified reset signal, and the comparison unit performs the comparison using a signal that has offset the held charge and the signal of the amplified reset signal as the offset amount signal, and generates the offset amount signal comparison result.

(4) The imaging element according to (3), wherein the comparison unit uses a signal that has offset the held charge and a signal of the amplified accumulated signal as a signal to be digitalized, compares the potential of a reference signal of a ramp wave, and a potential of the signal to be digitalized, and generates a signal to be digitalized comparison result indicating which potential is higher, when calculating a digital value of the accumulated signal, and the count unit performs down count from a count value in an initial state based on the offset amount signal comparison result, when calculating the digital value corresponding to an offset component of the comparison unit, and performs up count from a count value after the down count based on the signal to be digitalized comparison result, and calculates the digital value of the accumulated signal from which the digital value corresponding to an offset component of the comparison unit has been removed, when calculating the digital value of the accumulated signal.

(5) The imaging element according to (4), further including: a binary determination unit configured to compare the calculated digital value of the accumulated signal and a threshold, and to binarily determine existence of incidence of a photon to the pixel that has generated the accumulated signal.

(6) The imaging element according to (4), wherein the comparison unit continuously generates the offset signal comparison result to the same offset amount signal a plurality of times, and continuously generates the signal to be digitalized comparison result to the same signal to be digitalized a plurality of times, and the count unit calculates the digital value of the accumulated signal based on an added value of respective down count values of the offset signal comparison results continuously generated a plurality of times, and an added value of respective up count values of the signal to be digitalized comparison results continuously generated a plurality of times.

(7) The imaging element according to (2), wherein the holding unit holds a charge in a signal of the amplified accumulated signal, the comparison unit generates a signal that has offset the held charge and a signal of the amplified accumulated signal as the offset amount signal, when generating the offset amount signal comparison result, and uses a signal that has offset the held charge and the signal of the amplified accumulated signal as a signal to be digitalized, compares the potential of a reference signal of a ramp wave and a potential of the signal to be digitalized, and generates a signal to be digitalized comparison result, when calculating the digital value of the accumulated signal, and the count unit performs down count from a count value in an initial state based on the offset amount signal comparison result, when calculating the digital value corresponding to an offset component of the comparison unit, and performs up count from a count value after the down count based on the signal to be digitalized comparison result, and calculates the digital value of the accumulated signal from which the digital value corresponding to an offset component of the comparison unit has been removed, when calculating the digital value of the accumulated signal.

(8) The imaging element according to (2), wherein the comparison unit performs the comparison using the accuracy that is decreased according to an increase in the magnification set in the amplifier.

(9) The imaging element according to any one of (1) to (8), wherein the amplifier is configured from an operational amplifier provided in each calculation unit or a complementary metal oxide semiconductor (CMOS) inverter.

(10) The imaging element according to any one of (1) to (8), wherein the amplifier is configured from a source ground type amplifier transistor provided in each pixel.

(11) The imaging element according to any one of (1) to (8), wherein the amplifier is configured from a feedback circuit that feeds back a potential of a signal output by the pixel to a potential in floating diffusion of the pixel that has output the signal.

(12) An imaging device including: an amplifier configured to amplify signals of a pixel at a magnification larger than 1, the pixel outputting one of the signals as a reset signal, the signal being in a state in which there is no accumulation of a charge by a photon, and outputting the other of the signals as an accumulation signal, the signal being in a state in which there is accumulation of a charge by the photon; and a calculation unit configured to generate an offset amount signal corresponding to an amount of own offset component using the amplified signal, and to calculate a digital value corresponding to the own offset component using the generated offset amount signal and accuracy set for AD conversion of the amplified accumulated signal.

(13) An electronic device including: an amplifier configured to amplify signals of a pixel at a magnification larger than 1, the pixel outputting one of the signals as a reset signal, the signal being in a state in which there is no accumulation of a charge by a photon, and outputting the other of the signals as an accumulation signal, the signal being in a state in which there is accumulation of a charge by the photon; and a calculation unit configured to generate an offset amount signal corresponding to an amount of own offset component using the amplified signal, and to calculate a digital value corresponding to the own offset component using the generated offset amount signal and accuracy set for AD conversion of the amplified accumulated signal.

(14) An imaging method including: a procedure of amplifying signals of a pixel at a magnification larger than 1, the pixel outputting one of the signals as a reset signal, the signal being in a state in which there is no accumulation of a charge by a photon, and outputting the other of the signals as an accumulation signal, the signal being in a state in which there is accumulation of a charge by the photon; and a procedure of generating an offset amount signal corresponding to an amount of own offset component using the amplified signal, and calculating a digital value corresponding to the own offset component using the generated offset amount signal and accuracy set for AD conversion of the amplified accumulated signal.

REFERENCE SIGNS LIST

100 Imaging element
112 First vertical driving circuit
114 Register
115 Vertical driving circuit
118 Output circuit
210 REF signal generation unit
400 Determination circuit
410 ACDS unit
411 Comparator
412, 423, and 464 Switch
413, 462, 463, 471, and 472 Capacitor
420 DCDS unit
421 AD conversion unit
422 Register
424 Subtractor
440 Amplifier unit
460 Amplifier circuit
470 Register
480 Counter

The invention claimed is:

1. An imaging element comprising:

an amplifier configured to amplify signals of a pixel at a magnification larger than 1, the pixel outputting one of the signals as a reset signal, the signal being in a state in which there is no accumulation of a charge by a photon, and outputting the other of the signals as an accumulation signal, the signal being in a state in which there is accumulation of a charge by the photon; and calculation circuitry configured to generate an offset amount signal corresponding to an amount of own offset component using the amplified signal, and to calculate a digital value corresponding to the own offset component using the generated offset amount signal and accuracy set for AD conversion of the amplified accumulated signal, wherein the calculation circuitry includes holding circuitry configured to hold a charge in the amplified signal, comparison circuitry configured to cause a signal that has offset the held charge and the amplified signal to input and to use the signal as the offset amount signal, to compare a potential of a reference signal of a ramp wave in which a potential difference of a step corresponds to the accuracy, and a potential of the offset amount signal, and to generate an offset amount signal comparison result indicating which potential is higher, and count circuitry configured to count a pulse corresponding to the step of the ramp wave from a start of the comparison to when the offset amount signal comparison result is inverted, and to calculate the digital value corresponding to an offset component of the comparison circuitry.

2. The imaging element according to claim 1, wherein the holding circuitry holds a charge in a signal of the amplified reset signal, and the comparison circuitry performs the comparison using a signal that has offset the held charge and the signal of the amplified reset signal as the offset amount signal, and generates the offset amount signal comparison result.

3. The imaging element according to claim 2, wherein the comparison circuitry uses a signal that has offset the held charge and a signal of the amplified accumulated signal as a signal to be digitalized, compares the potential of a reference signal of a ramp wave, and a potential of the signal to be digitalized, and generates a signal to be digitalized comparison result indicating which potential is higher, when calculating a digital value of the accumulated signal, and the count circuitry performs down count from a count value in an initial state based on the offset amount signal comparison result, when calculating the digital value corresponding to an offset component of the comparison circuitry, and performs up count from a count value after the down count based on the signal to be digitalized comparison result, and calculates the digital value of the accumulated signal from which the digital value corresponding to an offset component of the comparison circuitry has been removed, when calculating the digital value of the accumulated signal.

4. The imaging element according to claim 3, further comprising:

binary determination circuitry configured to compare the calculated digital value of the accumulated signal and a threshold, and to binarily determine existence of incidence of a photon to the pixel that has generated the accumulated signal.

5. The imaging element according to claim 3, wherein the comparison circuitry continuously generates the offset signal comparison result to the same offset amount signal a plurality of times, and continuously generates the signal to be digitalized comparison result to the same signal to be digitalized a plurality of times, and the count circuitry calculates the digital value of the accumulated signal based on an added value of respective down count values of the offset signal comparison results continuously generated a plurality of times, and an added value of respective up count values of the signal to be digitalized comparison results continuously generated a plurality of times.

6. The imaging element according to claim 1, wherein the holding circuitry holds a charge in a signal of the amplified accumulated signal, the comparison circuitry generates a signal that has offset the held charge and a signal of the amplified accumulated signal as the offset amount signal, when generating the offset amount signal comparison result, and uses a signal that has offset the held charge and the signal of the amplified accumulated signal as a signal to be digitalized, compares the potential of a reference signal of a ramp wave and a potential of the signal to be digitalized, and generates a signal to be digitalized comparison result, when calculating the digital value of the accumulated signal, and the count circuitry performs down count from a count value in an initial state based on the offset amount signal comparison result, when calculating the digital value corresponding to an offset component of the comparison circuitry, and performs up count from a count value after the down count based on the signal to be digitalized comparison result, and calculates the digital value of the accumulated signal from which the digital value corresponding to an offset component of the comparison circuitry has been removed, when calculating the digital value of the accumulated signal.

7. The imaging element according to claim 1, wherein the comparison circuitry performs the comparison using the accuracy that is decreased according to an increase in the magnification set in the amplifier.

8. The imaging element according to claim 1, wherein the amplifier is configured from an operational amplifier provided in each calculation circuitry or a complementary metal oxide semiconductor (CMOS) inverter.

9. The imaging element according to claim 1, wherein the amplifier is configured from a source ground type amplifier transistor provided in each pixel.

10. The imaging element according to claim 1, wherein the amplifier is configured from a feedback circuit that feeds back a potential of a signal output by the pixel to a potential in floating diffusion of the pixel that has output the signal.

11. An imaging device comprising:

an amplifier configured to amplify signals of a pixel at a magnification larger than 1, the pixel outputting one of the signals as a reset signal, the signal being in a state in which there is no accumulation of a charge by a photon, and outputting the other of the signals as an accumulation signal, the signal being in a state in which there is accumulation of a charge by the photon; and calculation circuitry configured to generate an offset amount signal corresponding to an amount of own offset component using the amplified signal, and to calculate a digital value corresponding to the own offset component using the generated offset amount signal and accuracy set for AD conversion of the amplified accumulated signal, wherein the calculation circuitry includes holding circuitry configured to hold a charge in the amplified signal, comparison circuitry configured to cause a signal that has offset the held charge and the amplified signal to input and to use the signal as the offset amount signal, to compare a potential of a reference signal of a ramp wave in which a potential difference of a step corresponds to the accuracy, and a potential of the offset amount signal, and to generate an offset amount signal comparison result indicating which potential is higher, and count circuitry configured to count a pulse corresponding the step of the ramp wave from a start of the comparison to when the offset amount signal comparison result is inverted, and to calculate the digital value corresponding to an offset component of the comparison circuitry.

12. The imaging device according to claim 11, wherein the holding circuitry holds a charge in a signal of the amplified reset signal, and the comparison circuitry performs the comparison using a signal that has offset the held charge and the signal of the amplified reset signal as the offset amount signal, and generates the offset amount signal comparison result.

13. The imaging device according to claim 12, wherein the comparison circuitry uses a signal that has offset the held charge and a signal of the amplified accumulated signal as a signal to be digitalized, compares the potential of a reference signal of a ramp wave, and a potential of the signal to be digitalized, and generates a signal to be digitalized comparison result indicating which potential is higher, when calculating a digital value of the accumulated signal, and the count circuitry performs down count from a count value in an initial state based on the offset amount signal comparison result, when calculating the digital value corresponding to an offset component of the comparison circuitry, and performs up count from a count value after the down count based on the signal to be digitalized comparison result, and calculates the digital value of the accumulated signal from which the digital value corresponding to an offset component of the comparison circuitry has been removed, when calculating the digital value of the accumulated signal.

14. The imaging device according to claim 13, further comprising:

binary determination circuitry configured to compare the calculated digital value of the accumulated signal and a threshold, and to binarily determine existence of incidence of a photon to the pixel that has generated the accumulated signal.

15. An electronic device comprising:

an amplifier configured to amplify signals of a pixel at a magnification larger than 1, the pixel outputting one of the signals as a reset signal, the signal being in a state in which there is no accumulation of a charge by a photon, and outputting the other of the signals as an accumulation signal, the signal being in a state in which there is accumulation of a charge by the photon; and calculation circuitry configured to generate an offset amount signal corresponding to an amount of own offset component using the amplified signal, and to calculate a digital value corresponding to the own offset component using the generated offset amount signal and accuracy set for AD conversion of the amplified accumulated signal, wherein the calculation circuitry includes holding circuitry configured to hold a charge in the amplified signal, comparison circuitry configured to cause a signal that has offset the held charge and the amplified signal to input and to use the signal as the offset amount signal, to compare a potential of a reference signal of a ramp wave in which a potential difference of a step corresponds to the accuracy, and a potential of the offset amount signal, and to generate an offset amount signal comparison result indicating which potential is higher, and count circuitry configured to count a pulse corresponding to the step of the ramp wave from a start of the comparison to when the offset amount signal comparison result is inverted, and to calculate the digital value corresponding to an offset component of the comparison circuitry.

16. The electronic device according to claim 15, wherein the holding circuitry holds a charge in a signal of the amplified reset signal, and the comparison circuitry performs the comparison using a signal that has offset the held charge and the signal of the amplified reset signal as the offset amount signal, and generates the offset amount signal comparison result.

17. The electronic device according to claim 16, wherein the comparison circuitry uses a signal that has offset the held charge and a signal of the amplified accumulated signal as a signal to be digitalized, compares the potential of a reference signal of a ramp wave, and a potential of the signal to be digitalized, and generates a signal to be digitalized comparison result indicating which potential is higher, when calculating a digital value of the accumulated signal, and the count circuitry performs down count from a count value in an initial state based on the offset amount signal comparison result, when calculating the digital value corresponding to an offset component of the comparison circuitry, and performs up count from a count value after the down count based on the signal to be digitalized comparison result, and calculates the digital value of the accumulated signal from which the digital value corresponding to an offset component of the comparison circuitry has been removed, when calculating the digital value of the accumulated signal.

18. The electronic device according to claim 17, further comprising:

binary determination circuitry configured to compare the calculated digital value of the accumulated signal and a threshold, and to binarily determine existence of incidence of a photon to the pixel that has generated the accumulated signal.

19. An imaging method comprising:

amplifying signals of a pixel at a magnification larger than 1, the pixel outputting one of the signals as a reset signal, the signal being in a state in which there is no accumulation of a charge by a photon, and outputting the other of the signals as an accumulation signal, the signal being in a state in which there is accumulation of a charge by the photon; and generating an offset amount signal corresponding to an amount of own offset component using the amplified signal, and calculating a digital value corresponding to the own offset component using the generated offset amount signal and accuracy set for AD conversion of the amplified accumulated signal, wherein generating the offset amount includes holding a charge in the amplified signal, causing a signal that has offset the held charge and the amplified signal to input and using the signal as the offset signal amount, comparing a potential of a reference signal of a ramp wave in which a potential difference of a step corresponds to the accuracy, and a potential of the offset amount signal, and generating an offset amount signal comparison result indicating which potential is higher, and counting a pulse corresponding to the step of the ramp wave from a start of the comparison to when the offset amount comparison result is inverted, and calculating the digital value corresponds to an offset component of the comparison.

* * * * *